US012787891B2

(12) United States Patent
Murao et al.

(10) Patent No.: US 12,787,891 B2

(45) Date of Patent: Nov. 3, 2026

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventors: Tatsuya Murao, Kanagawa (JP); Yuki Kitazawa, Kanagawa (JP); Yasushi Koyama, Kanagawa (JP); Takahiro Yajima, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 337 days.

(21) Appl. No.: 18/664,919

(22) Filed: May 15, 2024

(65) Prior Publication Data

US 2024/0387453 A1 Nov. 21, 2024

(30) Foreign Application Priority Data

May 19, 2023 (JP) ................................ 2023-083184

(51) Int. Cl.

| | |
|---|---|
| ***H01L 25/04*** | (2023.01) |
| ***H01L 27/146*** | (2006.01) |
| ***H01L 31/02*** | (2006.01) |
| ***H01L 31/107*** | (2006.01) |
| ***H01L 31/108*** | (2006.01) |
| ***H10F 30/225*** | (2025.01) |
| ***H10F 30/227*** | (2025.01) |

(Continued)

(52) U.S. Cl.

CPC .......... *H10W 90/00* (2026.01); *H10F 30/225* (2025.01); *H10F 30/227* (2025.01); *H10F 39/198* (2025.01); *H10F 77/334* (2025.01); *H10F 77/933* (2025.01)

(58) Field of Classification Search

CPC ............... H10W 90/00; H10W 90/734; H10W 90/754; H10F 30/225; H10F 30/227; H10F 30/20; H10F 30/2255; H10F 39/198; H10F 39/12; H10F 39/1843; H10F 39/8033; H10F 39/8057; H10F 77/334; H10F 77/30; H10F 77/933; H10F 77/00; H10F 77/244; H10F 77/20; H10F 77/959

See application file for complete search history.

(56) References Cited

FOREIGN PATENT DOCUMENTS

| | | | |
|---|---|---|---|
| JP | H03231476 | A | 10/1991 |
| JP | 2010114186 | A | 5/2010 |

(Continued)

*Primary Examiner* — Nikolay K Yushin

(74) *Attorney, Agent, or Firm* — Canon U.S.A., Inc. IP Division

(57) ABSTRACT

A photoelectric conversion apparatus includes a semiconductor layer, an avalanche photodiode, an electrode film, and a wiring structure. The semiconductor layer has a first surface and a second surface. The avalanche photodiode is arranged in the semiconductor layer. The electrode film is arranged to contact the first surface. The wiring structure is arranged to contact the second surface. At least part of light from an outside enters the semiconductor layer via the electrode film. The electrode film includes a first electrode film and a second electrode film. The first electrode film is arranged to contact the first surface such that a Schottky barrier diode is formed in a contact portion with the semiconductor layer. The second electrode film contains a material different from the first electrode film and is arranged to overlap the first electrode film.

32 Claims, 17 Drawing Sheets

(51) Int. Cl.

| | |
|---|---|
| ***H10F 39/12*** | (2025.01) |
| ***H10F 77/00*** | (2025.01) |
| ***H10F 77/30*** | (2025.01) |
| ***H10W 90/00*** | (2026.01) |

(56) References Cited

FOREIGN PATENT DOCUMENTS

| | | | |
|---|---|---|---|
| JP | 2018201005 | A | 12/2018 |
| JP | 2020087955 | A | 6/2020 |
| JP | 2023059071 | A | 4/2023 |

PHOTOELECTRIC CONVERSION APPARATUS AND PHOTOELECTRIC CONVERSION SYSTEM

BACKGROUND

Technical Field

One disclosed aspect of the embodiments relates to a photoelectric conversion apparatus and a photoelectric conversion system.

Description of the Related Art

There is known a photodetector using an avalanche photodiode. Japanese Patent Laid-Open No. 2018-201005 discloses a photodetector in which a sensor chip including an avalanche photodiode and a logic chip including a circuit for processing a signal output from the avalanche photodiode are stacked. The avalanche photodiode includes an n-type semiconductor region and a p-type semiconductor region arranged under the n-type semiconductor region. The p-type semiconductor region includes a multiplication region where carriers generated by the incidence of detected light are avalanche-multiplied.

It is difficult for the photodetector described in Japanese Patent Laid-Open No. 2018-201005 to improve sensitivity to the infrared range, for example, the shortwave infrared range.

SUMMARY

The present disclosure provides a technique advantageous in improving sensitivity to the infrared range in a photoelectric conversion apparatus including an avalanche photodiode.

One of aspect of the disclosure provides a photoelectric conversion apparatus. The apparatus includes a semiconductor layer, an avalanche photodiode, an electrode film, and a wiring structure. The semiconductor layer has a first surface and a second surface. The avalanche photodiode is arranged in the semiconductor layer. The electrode film is arranged to contact the first surface. The wiring structure is arranged to contact the second surface. At least part of light from an outside may enter the semiconductor layer via the electrode film. The electrode film may include a first electrode film and a second electrode film. The first electrode film is arranged to contact the first surface such that a Schottky barrier diode may be formed in a contact portion with the semiconductor layer. The second electrode film contains a material different from the first electrode film and is arranged to overlap the first electrode film.

Further features of the disclosure will become apparent from the following description of exemplary embodiments with reference to the attached drawings.

DESCRIPTION OF THE EMBODIMENTS

Figure 1:
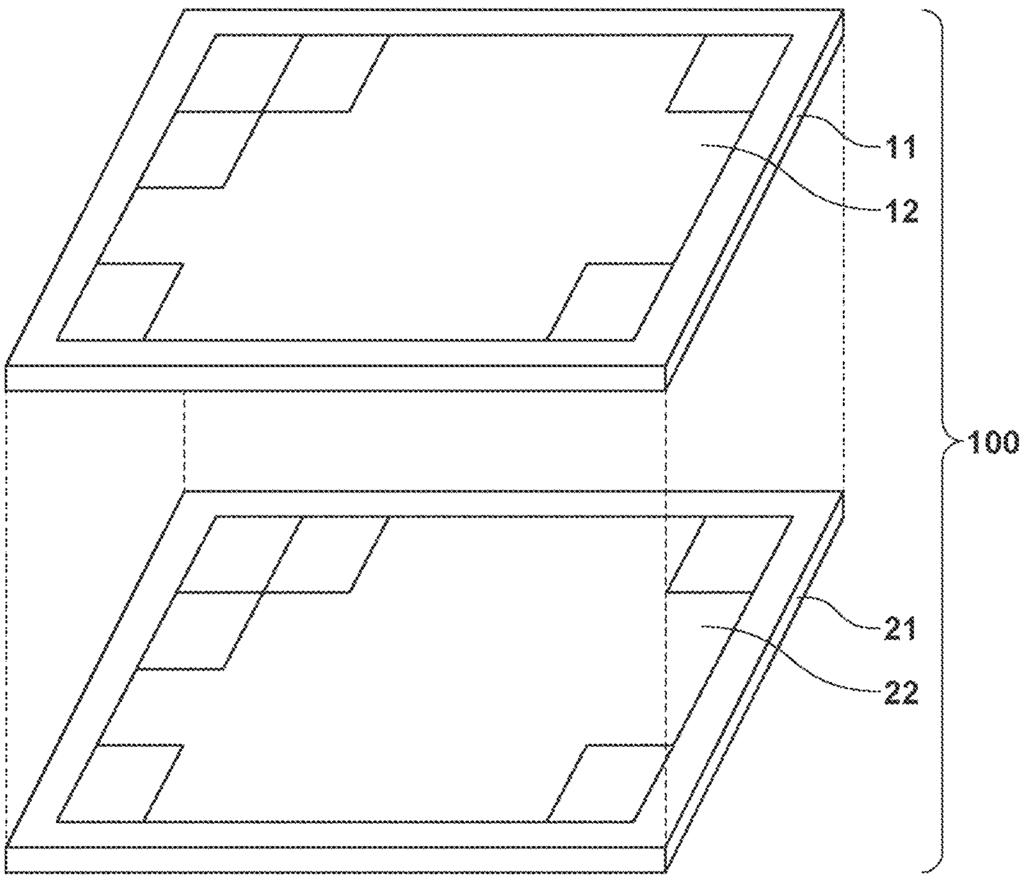
FIG. 1 is a view showing an example of the arrangement of a photoelectric conversion apparatus according to an embodiment.

Hereinafter, embodiments will be described in detail with reference to the attached drawings. Note, the following embodiments are not intended to limit the scope of the disclosure. Multiple features are described in the embodiments, but limitation is not made to a disclosure that requires all such features, and multiple such features may be combined as appropriate. Furthermore, in the attached drawings, the same reference numerals are given to the same or similar configurations, and redundant description thereof is omitted.

FIG. 1 schematically shows an example of the arrangement of a photoelectric conversion apparatus 100 according to an embodiment of the present disclosure. The photoelectric conversion apparatus 100 may have a structure in which a first substrate 11 and a second substrate 21 are stacked. The first substrate 11 may include a pixel array 12. The second substrate 21 may include a processing circuit 22 that processes a signal output from the pixel array 12.

Figure 2:
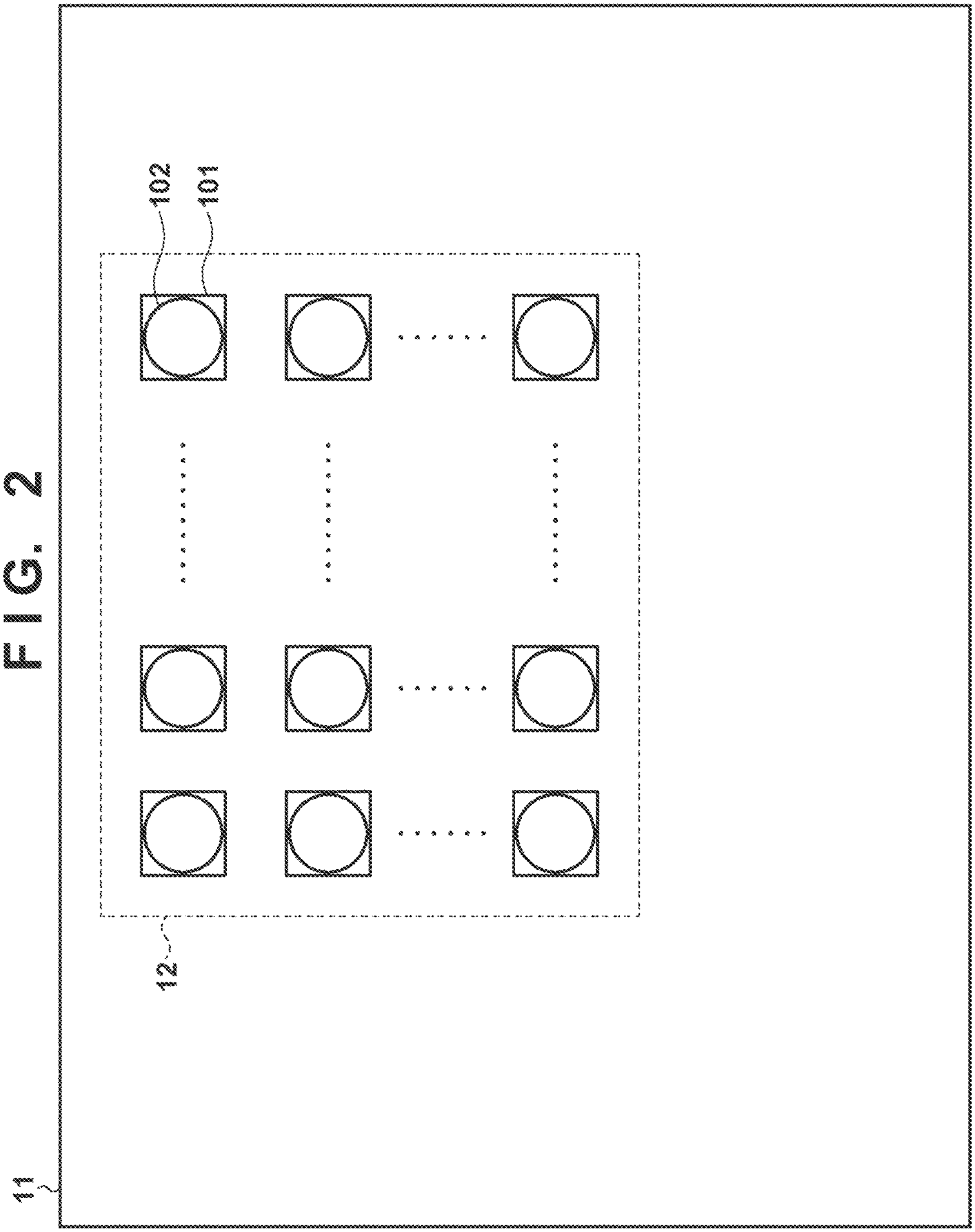
FIG. 2 is a view showing an example of the arrangement of the first substrate.

FIG. 2 schematically shows an example of the arrangement of the first substrate 11. The pixel array 12 of the first substrate 11 may include a plurality of pixels 101 arranged, disposed, placed, or positioned to form a plurality of rows and a plurality of columns. Each pixel 101 may include a photoelectric conversion unit 102. Each photoelectric conversion unit 102 includes an avalanche photodiode (to be also referred to as an APD hereinafter) and a Schottky barrier diode (to be also referred to as an SBD hereinafter) which are series-connected. The arrangement including the series-connected APD and SBD is advantageous in improving sensitivity to the infrared range, for example, the shortwave infrared range. The photoelectric conversion apparatus 100 will exemplarily be described below as an image capturing apparatus. However, the photoelectric conversion apparatus 100 may be formed as another apparatus. For example, the photoelectric conversion apparatus 100 may be formed as a distance measurement apparatus (for example, a distance measurement apparatus using a focus detection apparatus or TOF (Time Of Flight)) or a photometric apparatus (an apparatus for, for example, measuring an incident light amount). Note that the plurality of pixels 101 may be linearly arranged. In this case, the photoelectric conversion apparatus 100 may form a line sensor. Each pixel 101 may include the photoelectric conversion unit 102. The term "unit" here may refer to a circuit, an arrangement of semiconductor elements or parts. Note that the pixel 101 may be referred to as a unit cell and the pixel array 12 can be referred to as a unit cell array. The term "unit" in "unit cell" may refer to an individual element or item as part of a larger group, assembly, or combination.

Figure 3:
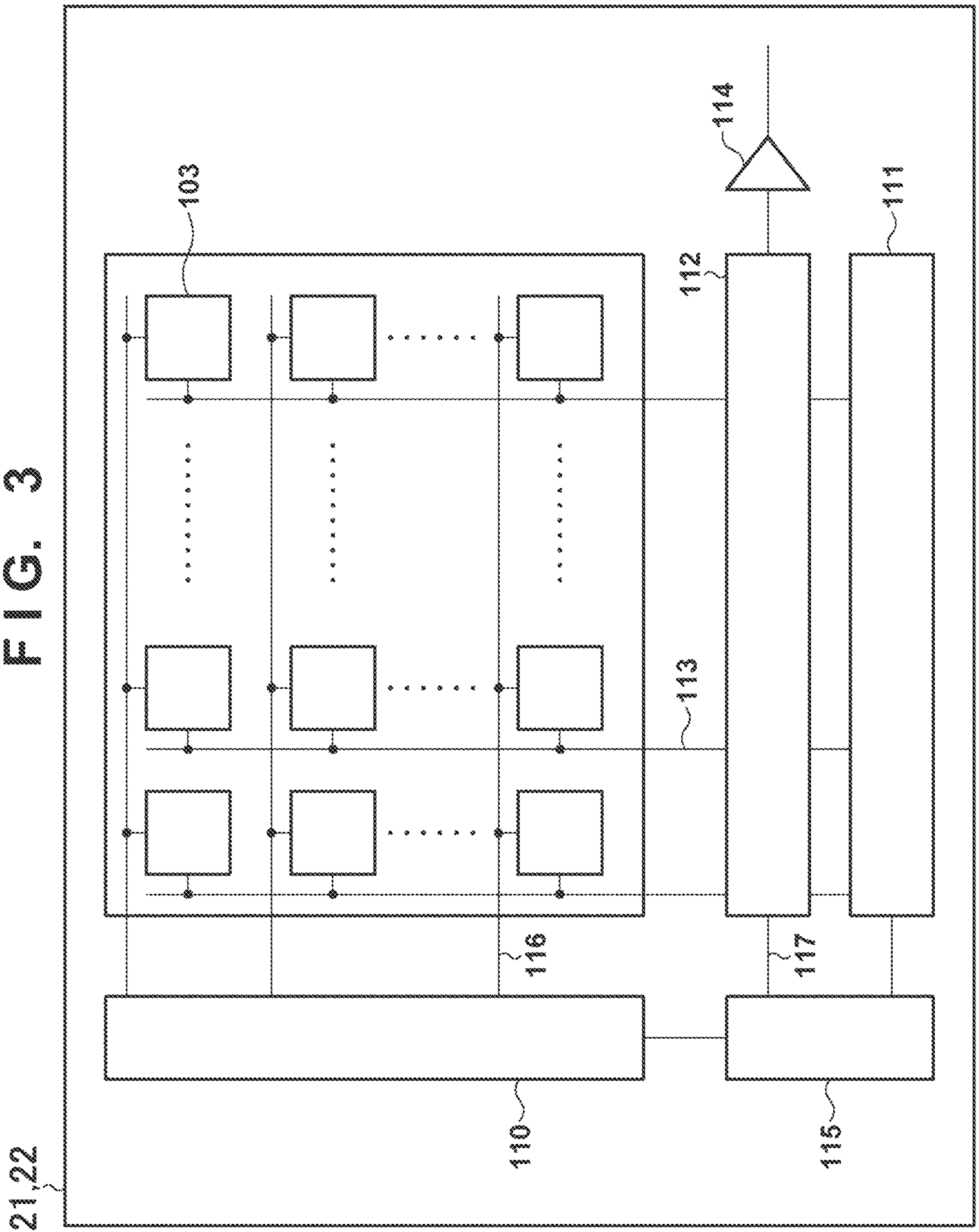
FIG. 3 is a view showing an example of the arrangement of the second substrate.

FIG. 3 schematically shows the arrangement of the processing circuit 22 of the second substrate 21. The processing circuit 22 may include, for example, a plurality of signal processing units or circuits 103, a readout circuit 112, a control unit 115, a horizontal scanning circuit 111, a plurality of signal lines 113, a vertical scanning circuit 110, and an output unit 114. Each signal processing unit 103 processes a signal output from the pixel 101. One signal processing unit 103 may be provided for one pixel 101, or one signal processing unit 103 may be provided for two or more pixels 101. In an example, one pixel 101 and one signal processing unit 103 may electrically be connected by a connection portion. The signal processing unit 103 may include, for example, a counter and a memory. The memory may hold a count value obtained by counting by the counter. A concrete arrangement of the connection portion is, for example, a structure in which conductor patterns of copper or the like are bonded, a structure using a micro-bump, or a structure in which a through electrode is provided.

For example, the vertical scanning circuit 110 may sequentially select a plurality of rows of the pixel array 12 in accordance with a control signal supplied from the control unit 115. The vertical scanning circuit 110 may supply a control signal to the pixel array 12 via a plurality of control signal lines 116. The vertical scanning circuit 110 may include, for example, at least one of a shift register and an address decoder. The readout circuit 112 reads out signals output, via the plurality of signal lines 113, from the signal processing units 103 corresponding to the pixels 101 of the row selected by the vertical scanning circuit 110. For example, the horizontal scanning circuit 111 supplies to the output unit 114, in a predetermined order, the signals for one row read out by the readout circuit 112.

Figure 4:
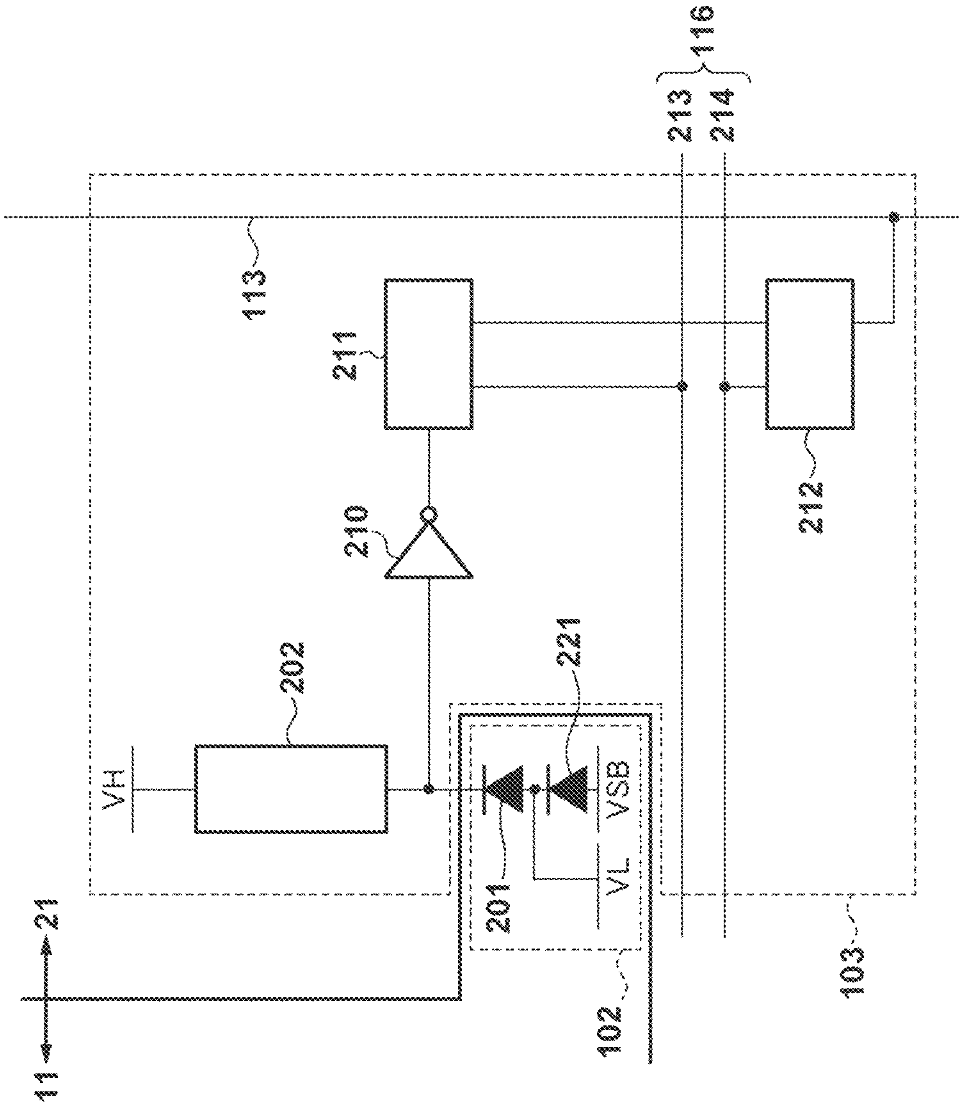
FIG. 4 is a circuit diagram showing an example of the arrangement of a pixel and a signal processing unit.

FIG. 4 shows an example of the arrangement of the photoelectric conversion unit 102 and the signal processing unit 103. In the example shown in FIG. 4, one signal processing unit 103 is assigned to one photoelectric conversion unit 102. The photoelectric conversion unit 102 includes an APD 201 and an SBD 221 which are series-connected. As described above, the photoelectric conversion unit 102 is arranged on the first substrate 11, and the signal processing unit 103 is arranged on the second substrate 21. However, at least one of a plurality of components of the signal processing unit 103 may be arranged on the first substrate 11. Alternatively, all the plurality of components of the signal processing unit 103 may be arranged on the first substrate 11. A solid line is a boundary between the first substrate 11 and the second substrate 21, and indicates the position of a junction portion. In this embodiment, one photoelectric conversion unit 102 and one signal processing unit 103 are paired.

A first potential VL may be applied to the anode of the APD 201, and a second potential VH may be applied to the cathode of the APD 201. The second potential VH is a potential higher than the first potential VL. That is, a potential difference between the first potential VL and the second potential VH is applied to the APD 201 (between the anode and cathode of the APD 201). This potential difference is a reverse bias voltage that causes the APD 201 to perform an avalanche multiplication operation. Charges generated by photons entering the APD 201 cause avalanche multiplication, thereby generating an avalanche current. A third potential VSB may be applied to the anode of the SBD 221 and the first potential VL may be applied to the cathode of the SBD 221. A mode of applying a voltage higher than the breakdown voltage of the APD 201 between the anode and cathode of the APD 201 is called a Geiger mode. A mode of applying a voltage around or lower than the breakdown voltage between the anode and cathode of the APD 201 is called a linear mode. An APD operating in the Geiger mode may be called a Single Photon Avalanche Diode (SPAD). In an example, the first potential VL is −30 V, the second potential VH is 1 V, and the third potential VSB is −31 V.

The signal processing unit 103 may include a quenching element or circuit 202 connected between the cathode of the APD 201 and a terminal supplied with the second potential VH. The quenching element 202 has a function of converting the change of the avalanche current generated in the APD 201 into a voltage signal. The quenching element 202 functions as a load circuit (quenching circuit) at the time of signal multiplication by avalanche multiplication, and serves to suppress avalanche multiplication by suppressing the voltage applied to the APD 201. This is known as a quenching operation.

The signal processing unit 103 may additionally include, for example, at least one of a waveform shaping unit or circuit 210, a counter circuit 211, and a selection circuit 212. The waveform shaping unit 210 may output a pulse signal by shaping the potential change of the cathode of the APD 201 at the time of detection of a photon. The waveform shaping unit 210 may include, for example, an inverter circuit. In the example shown in FIG. 4, the waveform shaping unit 210 is formed by one inverter but the waveform shaping unit 210 may be formed by series-connecting a plurality of inverters or by another circuit having the waveform shaping effect.

The counter circuit 211 may be configured to count a pulse signal output from the waveform shaping unit 210 and hold a count value obtained by counting. When a control pulse pRES of an active level is supplied from the vertical scanning circuit 110 via a driving line 213, the signal held in the counter circuit 211 may be reset. When a control pulse pSEL of an active level is supplied from the vertical scanning circuit unit 110 via a driving line 214, the selection circuit 212 may electrically connect the counter circuit 211 and the signal line 113. The selection circuit 212 may include, for example, a buffer circuit.

In this example, the counter circuit 211 is provided. However, the photoelectric conversion apparatus 100 may be configured to acquire a pulse detection timing by providing a Time-to-Digital Converter (to be referred to as a TDC hereinafter), instead of the counter circuit 211. In this case, the generation timing of the pulse signal output from the waveform shaping unit 210 may be converted into a digital signal by the TDC. A control pulse pREF (reference signal) may be supplied from the vertical scanning circuit unit 110 to the TDC via a driving line to measure the timing of the pulse signal. With reference to the control pulse pREF, the TDC may generate a digital signal corresponding to the generation timing of the pulse signal output from the waveform shaping unit 210.

Figure 5A:
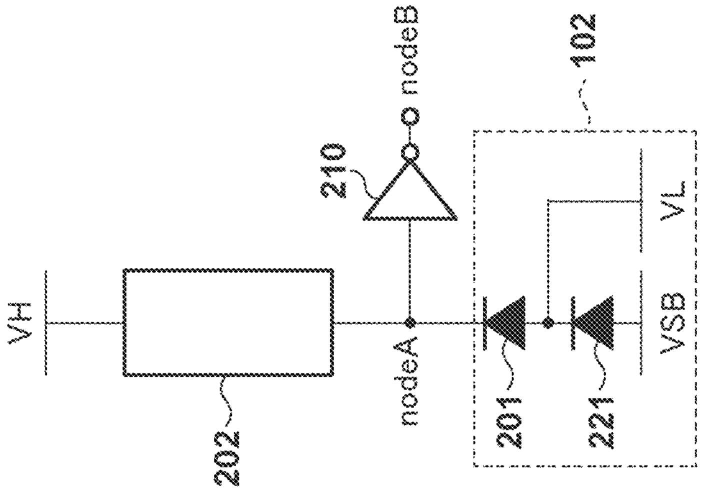
FIGS. 5A to 5C are a circuit diagram and timing charts for explaining a photon detection operation.
Figure 5B:
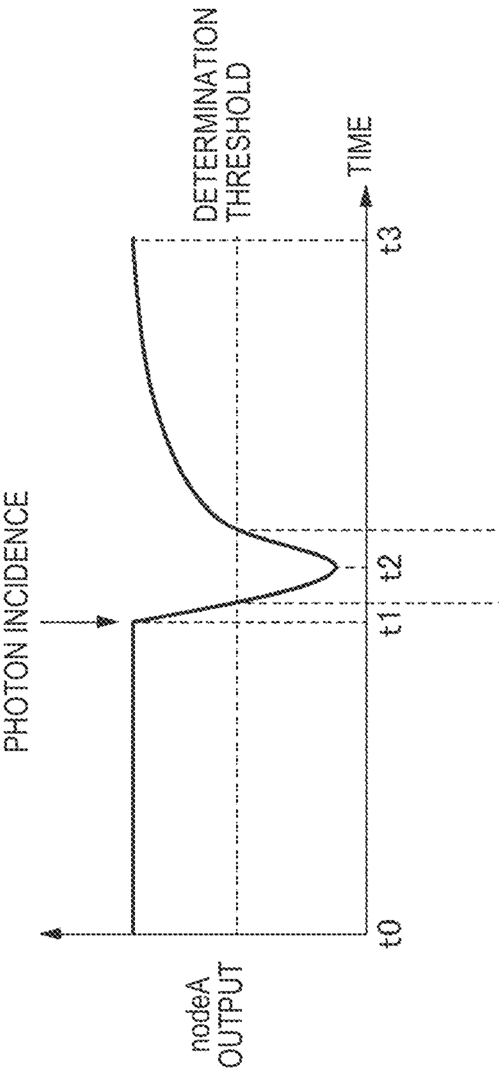
Figure 5C:
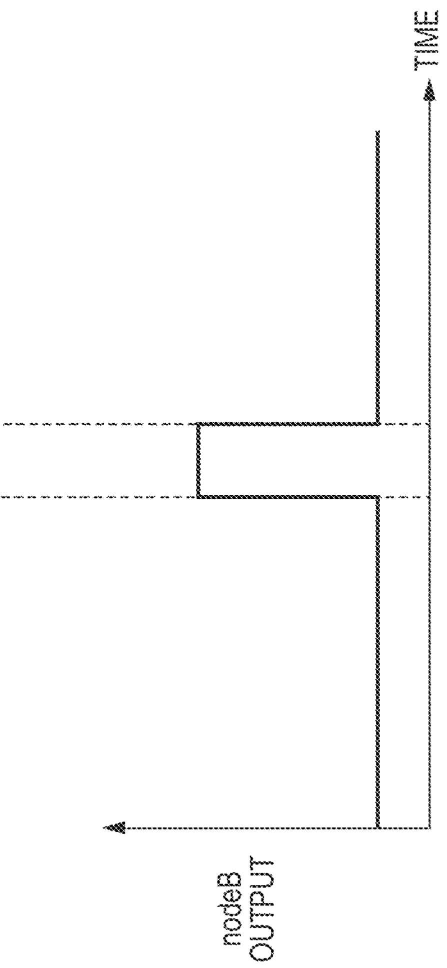

FIGS. 5A to 5C are a circuit diagram and timing charts for explaining a photon detection operation by the photoelectric conversion apparatus 100. FIG. 5A is a circuit diagram showing an excerpt of the APD 201, the SBD 221, the quenching element 202, and the waveform shaping unit 210 from FIG. 4. The input side of the waveform shaping unit 210 is a node A and the output side of the waveform shaping unit 210 is a node B. FIG. 5B shows the waveform at the node A of FIG. 5A and FIG. 5C shows the waveform at the node B of FIG. 5A. From time t0 to time t1, a potential difference of VH−VSB is applied to the photoelectric conversion unit 102 including the APD 201 and the SBD 221.

A potential difference of VH−VL is applied to the APD 201, and a potential difference of VL−VSB is applied to the SBD 221. When a photon enters at time t1, the SBD 221 generates a charge pair by photoelectric conversion, and avalanche multiplication occurs in the APD 201 in response to the charge pair. This causes an avalanche multiplication current to flow into the quenching element 202, and the voltage (potential) of the node A drops. When the voltage drop amount increases and the potential difference applied to the APD 201 decreases, the avalanche multiplication of the APD 201 stops. After that, a current compensating for the voltage drop from the voltage VL flows into the node A, and the node A is statically determined at the original potential level at time t3. At this time, a portion at which the output waveform exceeds a given threshold at the node A is waveform-shaped by the waveform shaping circuit 210 and a pulse signal appears at the node B.

Figure 6A:
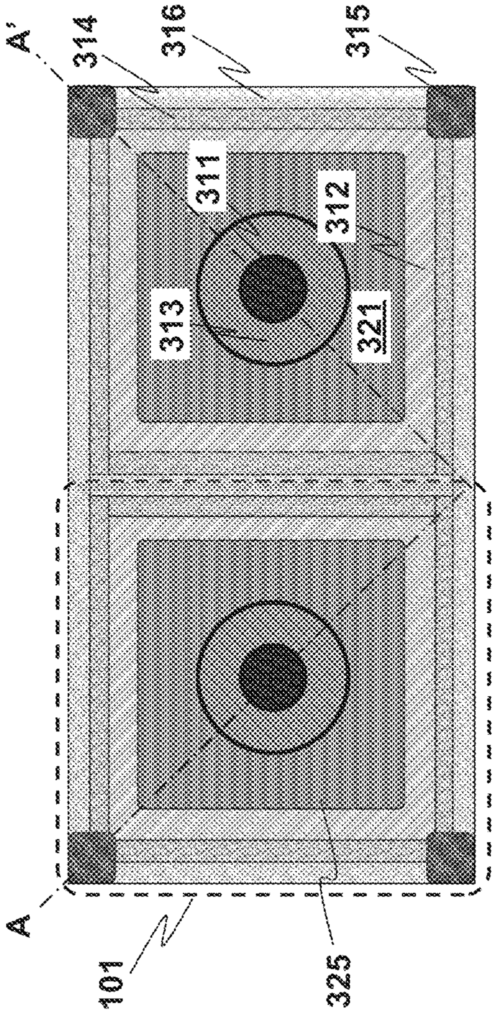
FIGS. 6A and 6B are plan views each showing pixels according to the first embodiment.
Figure 6B:
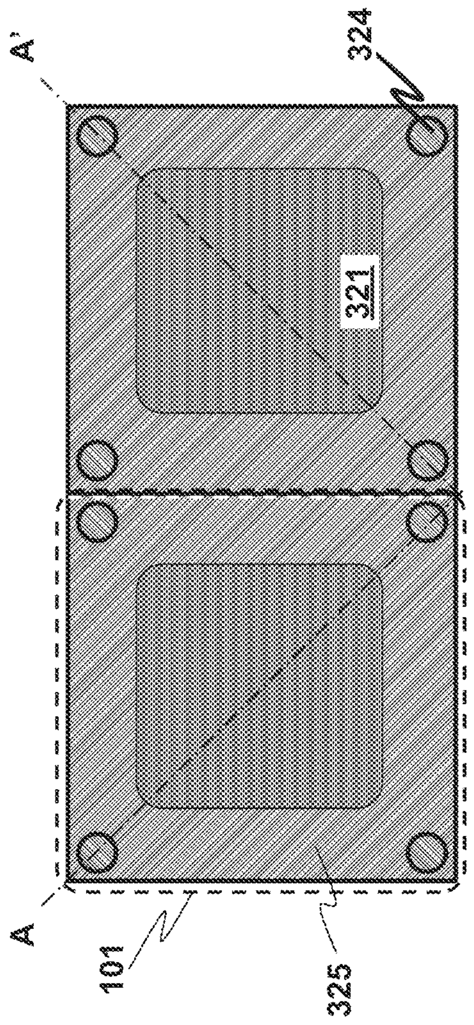
Figure 7:
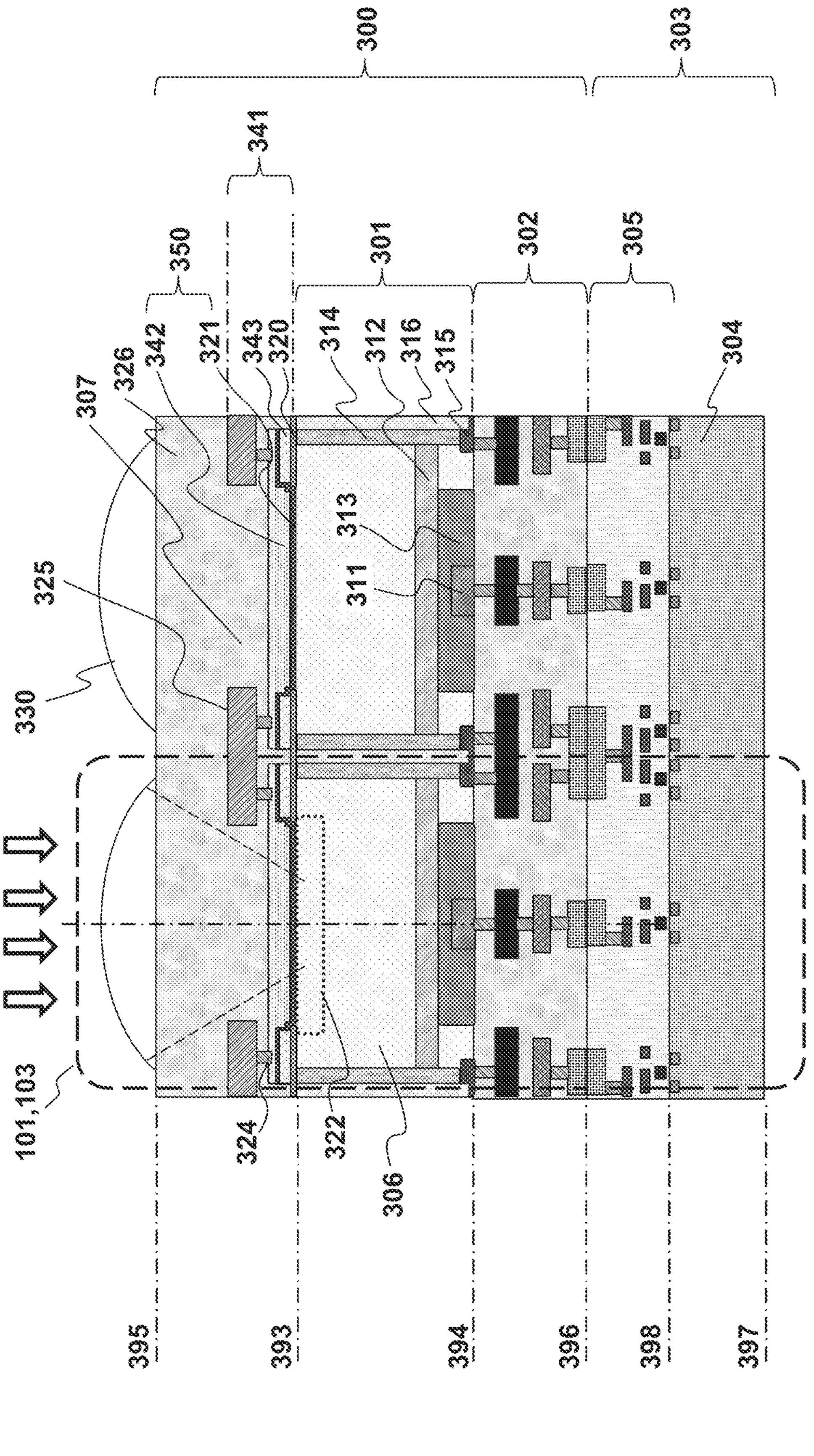
FIG. 7 is a sectional view showing the pixels according to the first embodiment.

FIGS. 6A, 6B, and 7 each schematically show the arrangement of the photoelectric conversion apparatus 100 for two pixels according to the first embodiment. FIG. 6A shows an overlap of the APD 201 and the SBD 221 on the plane, and FIG. 6B shows an overlap of the SBD 221 and its peripheral members on the plane. Note that a plan view is synonymous with an orthogonal projection to a first surface 393 or a second surface 394 to be described below, and is also called a planar view. FIG. 7 is a sectional view taken along a line A-A' in FIGS. 6A and 6B. In FIGS. 6A, 6B, and 7, a region surrounded by dotted lines represents one pixel 101 and the signal processing unit 103 corresponding to the pixel.

The photoelectric conversion apparatus 100 may include a first semiconductor layer (for example, a silicon layer) 301 having the first surface 393 and the second surface 394. The photoelectric conversion apparatus 100 may include a first wiring structure 302 having the second surface 394 and a fourth surface 396. The first wiring structure 302 may include at least one wiring layer each including a conductive pattern, and a plug electrically connected to the conductive pattern. The second surface 394 may be shared by the first semiconductor layer 301 and the first wiring structure 302. Alternatively, the second surface 394 may be the interface between the first semiconductor layer 301 and the first wiring structure 302.

The photoelectric conversion apparatus 100 may include a second semiconductor layer (for example, a silicon layer) 304 having a fifth surface 397 and a sixth surface 398. The photoelectric conversion apparatus 100 may include a second wiring structure 305 having the fourth surface 396 and the sixth surface 398. The second wiring structure 305 may include at least one wiring layer each including a conductive pattern, and a plug electrically connected to the conductive pattern. The fourth surface 396 may be shared by the first wiring structure 302 and the second wiring structure 305. Alternatively, the fourth surface 396 may be the interface between the first wiring structure 302 and the second wiring structure 305. The fourth surface 396 may be a junction surface. The sixth surface 398 may be shared by the second semiconductor layer 304 and the second wiring structure 305. Alternatively, the sixth surface 398 may be the interface between the second semiconductor layer 304 and the second wiring structure 305. The first semiconductor layer 301 and the first wiring structure 302 may form a first substrate 300. The first substrate 300 may be understood to further include the electrode film 350 and a sealing layer 326 to be described later. The second semiconductor layer 304 and the second wiring structure 305 may form a second substrate 303.

The photoelectric conversion apparatus 100 may include the electrode film 350 arranged to contact the first surface 393 of the first semiconductor layer 301. The first semiconductor layer 301 may include a semiconductor region 306 that forms at least part of the first surface 393. At least part of light from the outside of the photoelectric conversion apparatus 100 may enter the first semiconductor layer 301 through the electrode film 350. The electrode film 350 may include a first electrode film 321 arranged to contact the first surface 393 such that the Schottky barrier diode 221 is formed in a contact portion with the semiconductor region 306 of the first semiconductor layer 301, and a second electrode film 342 arranged to overlap the first electrode film 321. The second electrode film 342 may be formed by a material different from that of the first electrode film 321.

The first electrode film 321 and the second electrode film 342 are, for example, transparent or translucent in visible light and infrared (near infrared and shortwave infrared) bands. In other words, for example, the first electrode film 321 and the second electrode film 342 may transmit light (electromagnetic wave) in the visible light and infrared (near infrared and shortwave infrared) bands. At the wavelength of light to which the avalanche photodiode 201 has sensitivity, the light transmittance of the first electrode film 321 per unit thickness may be lower than the light transmittance of the second electrode film 342 per unit thickness. For example, the first electrode film 321 may be configured to transmit 1% or more, preferably 20% or more, and more preferably 50% or more of light (electromagnetic wave) in the visible light and infrared (near infrared and shortwave infrared) bands. The sheet resistance value of the second electrode film 342 is preferably lower than that of the first electrode film 321. The sheet resistance value of the first electrode film 321 may fall within, for example, a range of several tens of Ω/sq to several hundred Ω/sq. The sheet resistance value of the second electrode film 342 is lower than that of the first electrode film 321, and may fall within a range of 2 to 100 Ω/sq. In a direction along the first surface 393, the dimension of a region where the first electrode film 321 contacts the first surface 393 is preferably larger than the dimension of a first semiconductor region 311 (to be described later).

The second electrode film 342 may have a multilayer structure. The multilayer structure may be designed to improve the light transmittance of the second electrode film 342. The electrode film 350 may further include the third electrode film arranged between the first electrode film 321 and the second electrode film 342. For example, the third electrode film may function to improve the adhesion between the first electrode film 321 and the second electrode film 342.

The third electrode film may be configured not to inhibit the light transmission property of the electrode film 350. The first electrode film 321 may have, for example, a thickness of 1 nm (inclusive) to 100 nm (inclusive).

The APD 201 may be arranged between the second surface 394 and the SBD 221. In an orthogonal projection to the second surface 394, the avalanche photodiode 201 and the Schottky barrier diode 221 may overlap each other. The electrode film 350 may be applied with a potential to form a depletion region 322 in the first semiconductor layer 301.

The avalanche photodiode 201 and the Schottky barrier diode 221 are series-connected via the depletion region 322.

The photoelectric conversion apparatus 100 may further include a light shielding film 325. The light shielding film 325 may be a metal film. The light shielding film 325 may be arranged so that the first surface 393 is located between the second surface 394 and the light shielding film 325. The light shielding film 325 includes an opening that defines light entering the Schottky barrier diode 221. The light shielding film 325 may electrically be connected to the electrode film 350. For example, the light shielding film 325 may electrically be connected to the electrode film 350 via a plug 324.

The electrode film 350 and the light shielding film 325 may be covered with the sealing layer 326. The sealing layer 326 may have a third surface 395. A microlens 330 may be arranged on the sealing layer 326. The sealing layer 326 may include, for example, a color filter, a planarization film, and a protection film made of an inorganic material. At least part of the third surface 395 may be shared by the sealing layer 326 and the microlens 330. Alternatively, at least part of the third surface 395 may be the interface between the sealing layer 326 and the microlens 330. The microlens 330 may be integrated with the sealing layer 326. In this case, the third surface 395 may include a point at which two microlenses 330 contact each other. Light from the outside of the photoelectric conversion apparatus 100 may enter the first semiconductor layer 301 through the microlens 330, the sealing layer 326, and the electrode film 350. The second electrode film 342 may have a refractive index between the refractive index of the first electrode film 321 and that of the sealing layer 326.

The avalanche photodiode 201 may include the first semiconductor region 311 of the first conductivity type and a second semiconductor region 312 of the second conductivity type. In addition, the avalanche photodiode 201 may include a third semiconductor region 313 of the first conductivity type arranged between the second surface 394 and the second semiconductor region 312. In an example, the first conductivity type is an n type and the second conductivity type is a p type, and vice versa. The third semiconductor region 313 may include a portion arranged between the second surface 394 and the second semiconductor region 312 to surround the side surface of the first semiconductor region 311, and a portion arranged between the first semiconductor region 311 and the second semiconductor region 312. The semiconductor region 306 as part of the first semiconductor layer 301 may be a semiconductor region of the first conductivity type or a semiconductor region of the second conductivity type. In the semiconductor region 306, the impurity concentration (net concentration) of the second conductivity type is preferably lower than those in the second semiconductor region 312 and a fourth semiconductor region 314.

The photoelectric conversion apparatus 100 may further include the fourth semiconductor region 314 of the second conductivity type. The fourth semiconductor region 314 is electrically connected to the second semiconductor region 312, and extends between the first surface 393 and the second surface 394 in a direction orthogonal to the first surface 393. A potential may be applied to the second semiconductor region 312 via the fourth semiconductor region 314. The fourth semiconductor region 314 may be arranged to surround the first semiconductor region 311, the second semiconductor region 312, and the third semiconductor region 313. A fifth semiconductor region 315 of the second conductivity type may be arranged between the second surface 394 and the fourth semiconductor region 314. The impurity concentration of the second conductivity type in the fifth semiconductor region 315 is higher than that in the fourth semiconductor region 314.

The photoelectric conversion apparatus 100 may further include a pinning film 320 that covers the first surface 393. The pinning film 320 may be, for example, an insulating film made of at least one of hafnium oxide, zirconium oxide, aluminum oxide, titanium oxide, and tantalum oxide. The pinning film 320 includes an opening, and the electrode film 350 may be arranged to contact the first surface 393 via the opening of the pinning film 320. The light shielding film 325 includes an opening 307 that defines light entering the Schottky barrier diode 221. The light shielding film 325 and the electrode film 350 may electrically be connected by the plug 324. The electrode film 350 includes a region that covers the pinning film 320, and the plug 324 may be connected to the electrode film 350 within the region. An insulating film 343 may be arranged between the plug 324 and the pinning film 320. The insulating film 343 is advantageous in preventing a contact hole for forming the plug 324 from extending through the pinning film 320 to reach the first semiconductor layer 301 at the time of forming the contact hole. The insulating film 343 is advantageous in relaxing the electric field intensity between the electrode film 350 and the fourth semiconductor region 314.

The first surface 393 of the first semiconductor layer 301 may be sealed by the pinning film 320. The pinning film 320 includes an opening, and the first electrode film 321 of the electrode film 350 contacts the semiconductor region (for example, silicon) 306 of the first semiconductor layer 301 via the opening of the pinning film 320, thereby forming a Schottky junction portion. The first electrode film 321 is made of a material that forms the Schottky junction portion by the semiconductor region 306 and the first electrode film 321. The first electrode film 321 may be made of, for example, a metal, a metal silicide, or a metal oxide. In the Schottky junction portion, a Schottky barrier arising from a difference in work function between the semiconductor region 306 and the first electrode film 321 is formed. The height of the Schottky barrier is preferably equal to or smaller than ½ of the bandgap of the semiconductor region 306 constituting the first semiconductor layer 301. When the Schottky junction portion of the Schottky barrier diode 221 is irradiated with light (a wavelength of 0.8 to 30 m) of the infrared wavelength range having energy exceeding the height of the Schottky barrier, electrons or holes climb up the Schottky barrier to reach the depletion region 322.

As the material of the first electrode film 321 constituting the Schottky barrier diode, the following metal materials, metal silicides, metal oxides, and the like may preferably be used. As the metal materials, ytterbium (Yb), aluminum (Al), manganese (Mn), bismuth (Bi), tin (Sn), antimony (Sb), lead (Pb), hafnium (Hf), zirconia (Zr), silver (Ag), titanium (Ti), and the like may preferably be used as materials having sensitivity in a wavelength band of 1,550 to 1,800 nm (0.7 to 0.8 eV). In addition, nickel (Ni), iron (Fe), gold (Au), palladium (Pd), platinum (Pt), and the like are suitable as materials having sensitivity in a wavelength band of 2,000 to 2,500 nm (0.5 to 0.6 eV).

As the metal silicide as a compound of silicon and a metal, yttrium silicide ($YSi_2$) may be used as a material having sensitivity at a wavelength of 1,550 nm (0.75 eV), and Zirconium silicide ($ZrSi_2$), hafnium silicide (HfSi), nickel silicide (NiSi, $NiSi_2$), titanium silicide ($TiSi_2$), cobalt silicide ($CoSi_2$), manganese silicide (MnSi), and the like may be used as materials having sensitivity at a wavelength of 2,500 to 3,000 nm (0.4 to 0.5 eV). Furthermore, iridium silicide (IrSi) and platinum silicide (PtSi, $Pt_2Si$) may be used as materials having sensitivity at a wavelength of 4,000 to 6,000 nm (0.2 to 0.3 eV).

As the metal oxide, an oxide semiconductor as a metal oxide such as indium tin oxide (ITO), indium zinc oxide (IZO), zinc oxide (ZnO), indium gallium zinc oxide (IGZO), tin oxide ($SnO_2$), titanium oxide ($TiO_2$), and molybdenum oxide ($MoO_2$) may be used.

Light entering the Schottky junction interface between the semiconductor region 306 and the first electrode film 321 of the electrode film 350 is photoelectrically converted, thereby generating charges. The first electrode film 321 is thus preferably semi-transparent or transparent (light transmittance of, for example, about 1% to 100%) at the wavelength of received light. Therefore, the thickness of the first electrode film 321 is equal to or smaller than a wavelength $\lambda$ of received light, is preferably equal to or smaller than $\lambda/10$, and may typically be adjusted to a thickness of 100 nm or less. More specifically, if the first electrode film 321 is made of PtSi, a light transmittance of about 80% may be implemented with a thickness of 3 nm, and a light transmittance of about 50% may be implemented with a thickness of 20 nm. Alternatively, if the first electrode film 321 is made of gold (Au), a light transmittance of about 20% to 30% may be implemented with a thickness of 8 nm.

The second electrode film 342 of the electrode film 350 is formed to transmit received light. The first electrode film 321 may be made of a material that may form the Schottky barrier diode and may have a small thickness to implement a high light transmittance. Therefore, the first electrode film 321 may have a high sheet resistance value. The second electrode film 342 may be made of a material advantageous in lowering the sheet resistance value of the electrode film 350. The second electrode film 342 may be made of, for example, one of ITO, IZO, ZnO, and IGZO. Since silicon (Si), germanium (Ge), or the like has a transmission property depending on a target wavelength band, it may be used for the second electrode film 342 by setting a high impurity concentration. The thickness of the second electrode film 342 may be set to 100 nm or more and more preferably 200 nm or more to implement a low resistance value.

The second electrode film 342 may be formed to have an area equal to or larger than that of the first electrode film 321 in a plan view (an orthogonal projection to the first surface 393). This ensures the conductivity of the electrode film 350. In addition, since the transmittance of the first electrode film 321 lowers due to reflection at the refractive index of a metal forming the first electrode film 321, it is possible to improve the transmittance by providing an antireflection layer. More specifically, the second electrode film 342 is arranged between the first electrode film 321 and the sealing layer 326. At this time, the second electrode film 342 may be formed to have a refractive index between the refractive index of the first electrode film 321 and that of the sealing layer 326. Thus, the second electrode film 342 may function as an antireflection layer.

In a plan view (an orthogonal projection to the first surface 393), the first electrode film 321 of the electrode film 350 has a rectangular shape, and may be arranged on the first surface 393 of the first semiconductor layer 301. In a peripheral portion within the region of the first electrode film 321, the plug 324 that electrically connects the light shielding film 325 and the electrode film 350 may be arranged. The sealing layer 326 may be arranged to cover the second electrode film 342 of the electrode film 350. The light shielding film 325 for blocking stray light may be arranged between the second electrode film 342 and the third surface 395 as the upper surface of the sealing layer 326. The light shielding film 325 includes the opening 307, and light enters the electrode film 350 via the opening 307. The opening 307 is arranged to overlap the electrode film 350. The light shielding film 325 may be used to apply a potential to the electrode film 350. The light shielding film 325 may be supplied with the third potential VSB via a conductive path (not shown). The third potential VSB may be supplied from the light shielding film 325 to the electrode film 350 via the plug 324. This forms the depletion region 322 inside the semiconductor region 306. The width of the opening 307 may be smaller than that of the first electrode film 321. The area of the opening 307 may be smaller than that of the first electrode film 321. The electrode film 350, the plug 324, and the light shielding film 325 may be understood to form an SBD electrode layer 341.

The insulating film 343 may be arranged between the pinning film 320 and the electrode film 350 that covers the pinning film 320. The insulating film 343 is advantageous in ensuring the insulating property between the fourth semiconductor region 314 and the first electrode film 321 as the electrode of the SBD 221. Since the fourth semiconductor region 314 and the electrode film 350 have different potentials, noise may occur due to a leakage current or dielectric breakdown. By providing the insulating film 343, it is possible to prevent unnecessary noise from occurring in the region of the high-sensitivity APD 201.

To form the large opening 307, the plug 324 is desirably formed in a region that does not overlap the depletion region 322. The plug 324 may be arranged in a region where the first electrode film 321, the second electrode film 342, and the insulating film 343 overlap one another and where incident light is blocked by the light shielding film 325. This may prevent a contact hole for the plug 324 from extending through the thin first electrode film 321 and the pinning film 320 to reach the first semiconductor layer 301 when forming the contact hole from the side of the third surface 395. That is, the insulating film 343 may function as a buffer layer for preventing the plug 324 from extending through the thin first electrode film 321 and the pinning film 320 to be electrically connected to the first semiconductor layer 301.

The microlens 330 may be stacked on the side of the third surface 395 of the sealing layer 326. The amount of light obtained by collecting incident light in the direction of the SBD 221 and the APD 201 and photoelectrically converting it may be increased by arranging the microlens 330 at the center of the pixel, thereby improving the sensitivity of the photoelectric conversion apparatus 100. Light entering from the side of the third surface 395 is collected by the microlens 330, passes through the sealing layer 326 and the opening 307, and reaches the Schottky barrier diode 221 formed on the first surface 393 of the semiconductor region 306 constituting the first semiconductor layer 301. The light that has reached the depletion region 322 generates charges, and the charges are diffused inside the semiconductor region 306 of the first semiconductor layer 301 by an electric field applied to the SBD 221, and reach the second semiconductor region 312 of the second conductivity type.

The first semiconductor region 311 of the first conductivity type functions as the cathode of the APD 201, and is applied with the second potential VH. The fifth semiconductor region 315 of the second conductivity type functions as the anode of the APD 201, and is applied with the first potential VL. The first potential VL is applied to the second semiconductor region 312 of the second conductivity type via the fourth semiconductor region 314 of the second conductivity type. This forms an avalanche multiplication region in a region where the first semiconductor region 311 of the first conductivity type and the second semiconductor region 312 of the second conductivity type are close to each other. When charges (that may include charges generated by the SBD 221) generated by incident light pass through the avalanche region, they cause avalanche multiplication, generating an avalanche current. The fourth semiconductor region 314 of the second conductivity type may also function as an isolation region between the adjacent pixels. The fifth semiconductor region 315 of the second conductivity type may function to reduce a contact resistance between the first semiconductor layer 301 and a conductive member (for example, a plug) arranged in the first wiring structure 302. The impurity concentration of the second conductivity type is higher in the fifth semiconductor region 315 than in the fourth semiconductor region 314. An isolation trench 316 may be arranged between the fourth semiconductor region 314 of one pixel and the fourth semiconductor region 314 of its adjacent pixel. The isolation trench 316 is advantageous in reducing crosstalk between the adjacent pixels. The third semiconductor region 313 of the first conductivity type may be arranged to cover the corner portion of the first semiconductor region 311 of the first conductivity type, thereby suppressing a local high electric field region from being formed between the first semiconductor region 311 of the first conductivity type and the fifth semiconductor region 315 of the second conductivity type. The isolation trench 316 may be a groove or a through hole provided in the first semiconductor layer 301. A pinning layer, an air gap, an insulating layer containing a dielectric, a layer made of an opaque material for light shielding, and the like may be arranged inside the isolation trench 316.

Figure 8A:
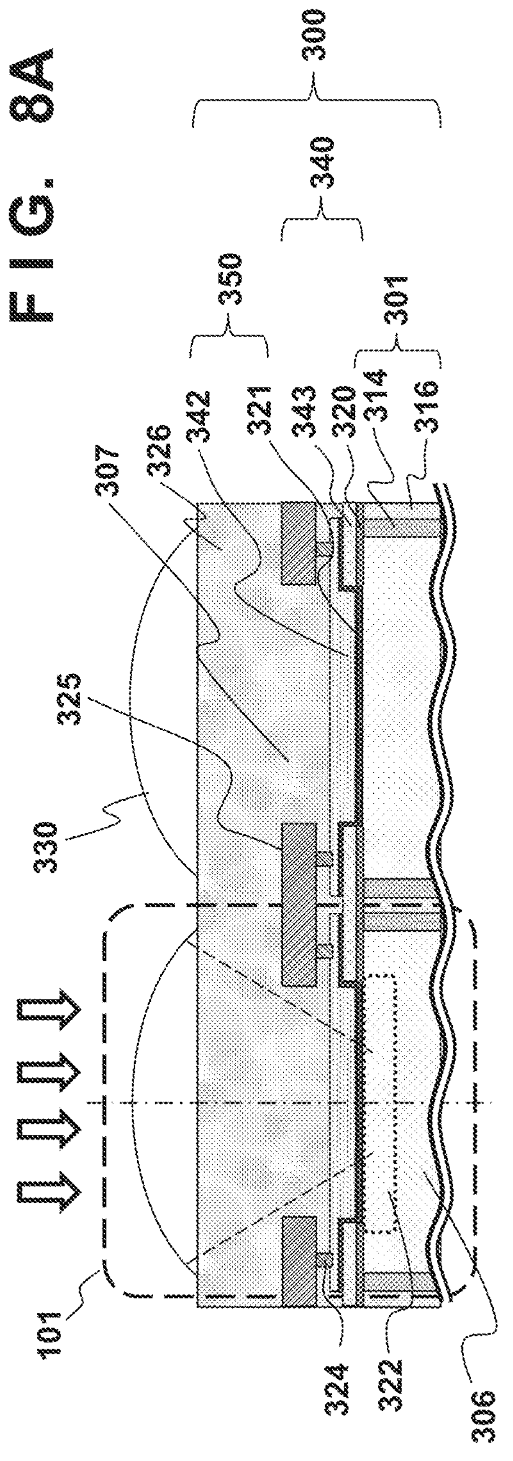
FIGS. 8A and 8B are sectional views each showing pixels according to a modification of the first embodiment.
Figure 8B:
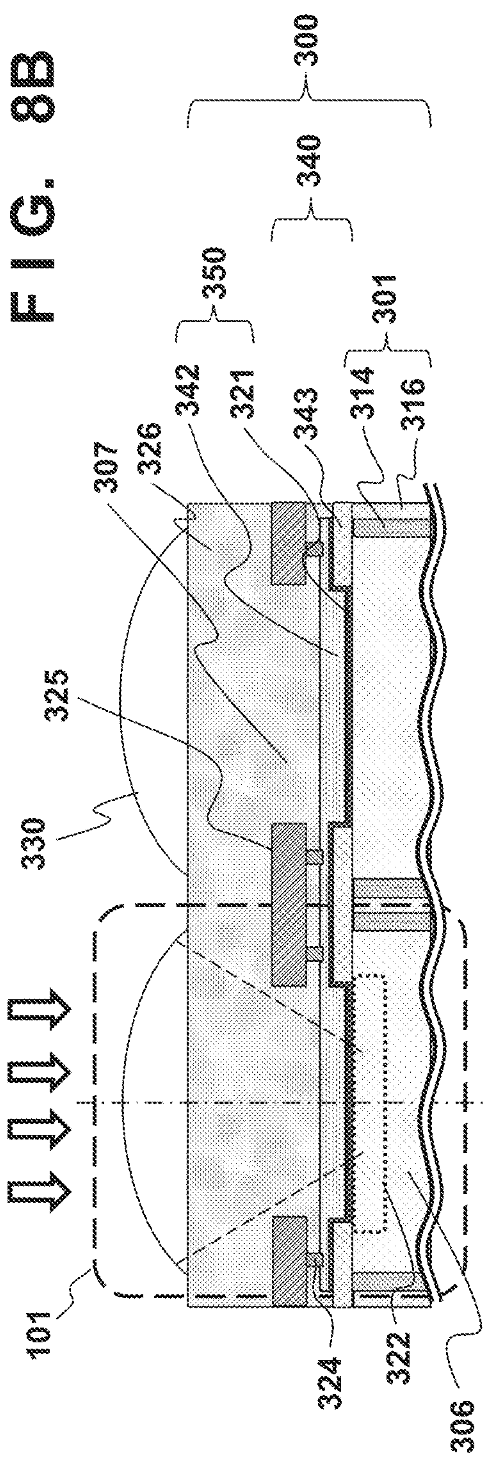

FIGS. 8A and 8B each show a modification of the arrangement example shown in FIG. 7. In the modification shown in each of FIGS. 8A and 8B, the SBD electrode layer 341 in the arrangement example shown in FIG. 7 is replaced by an SBD electrode layer 340. In the first modification shown in FIG. 8A, the pinning film 320 and the insulating film 343 have openings of the same shape. In the second modification shown in FIG. 8B, the insulating film 343 also serves as the pinning film 320.

The pinning film 320 and the insulating film 343 for one pixel may be connected to the pinning film 320 and the insulating film 343 of the adjacent pixel. The first electrode film 321 and the second electrode film 342 need not be isolated between the pixels and may be arranged over a plurality of pixels.

Electrical connection between the light shielding film 325 and the electrode film 350 (second electrode film 342) may be implemented not by the plug 324 but by providing a portion where the light shielding film 325 is directly stacked on the electrode film 350 (second electrode film 342). It is necessary to ensure the insulating property between the fourth semiconductor region 314 and the SBD electrode layer (the first electrode film 321, the second electrode film 342, the plug 324, the light shielding film 325, and the like). To do this, the insulating film 343 may be arranged between the fourth semiconductor region 314 and the SBD electrode layer in a structure according to the purpose.

The size of the depletion region 322 and the contact surface between the first electrode film 321 and the semiconductor region 306 may be equal to or larger than the size of a luminous flux collected by the microlens 330. This may make the incident light efficiently reach the SBD 221, thereby improving sensitivity. However, if the area of the Schottky junction between the first electrode film 321 and the semiconductor region 306 is large, dark current noise increases, and thus the area of the first electrode film 321 and the area of the opening of the pinning film 320 may be decided in consideration of sensitivity and noise.

The material of the first electrode film 321 that forms the SBD 221 may be selected in accordance with the wavelength of the incident light. An electrode material for forming a Schottky junction includes a material having a low transmittance with respect to a wavelength in the infrared range or the like. In this embodiment, by compensating the conductivity by the second electrode film 342 while ensuring the light transmission property by decreasing the thickness of the first electrode film 321, it is possible to improve the degree of freedom of selection of the material of the first electrode film 321.

Figure 9A:
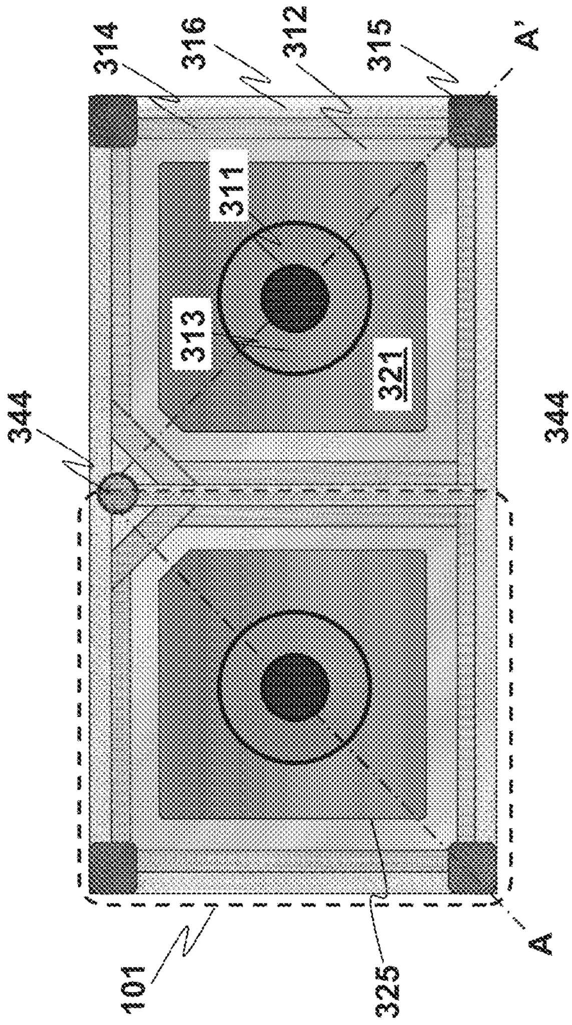
FIGS. 9A and 9B are plan views each showing pixels according to the second embodiment.
Figure 9B:
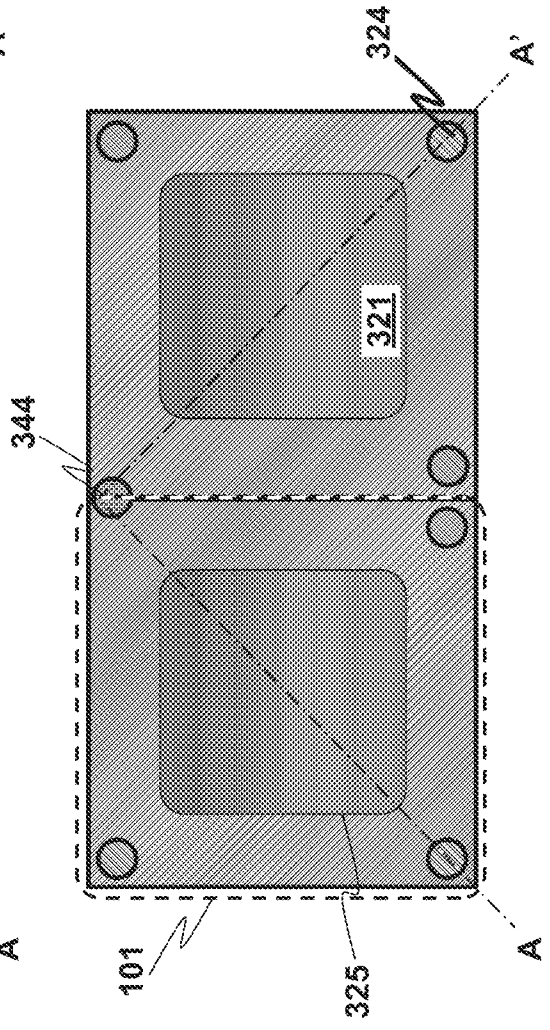
Figure 10:
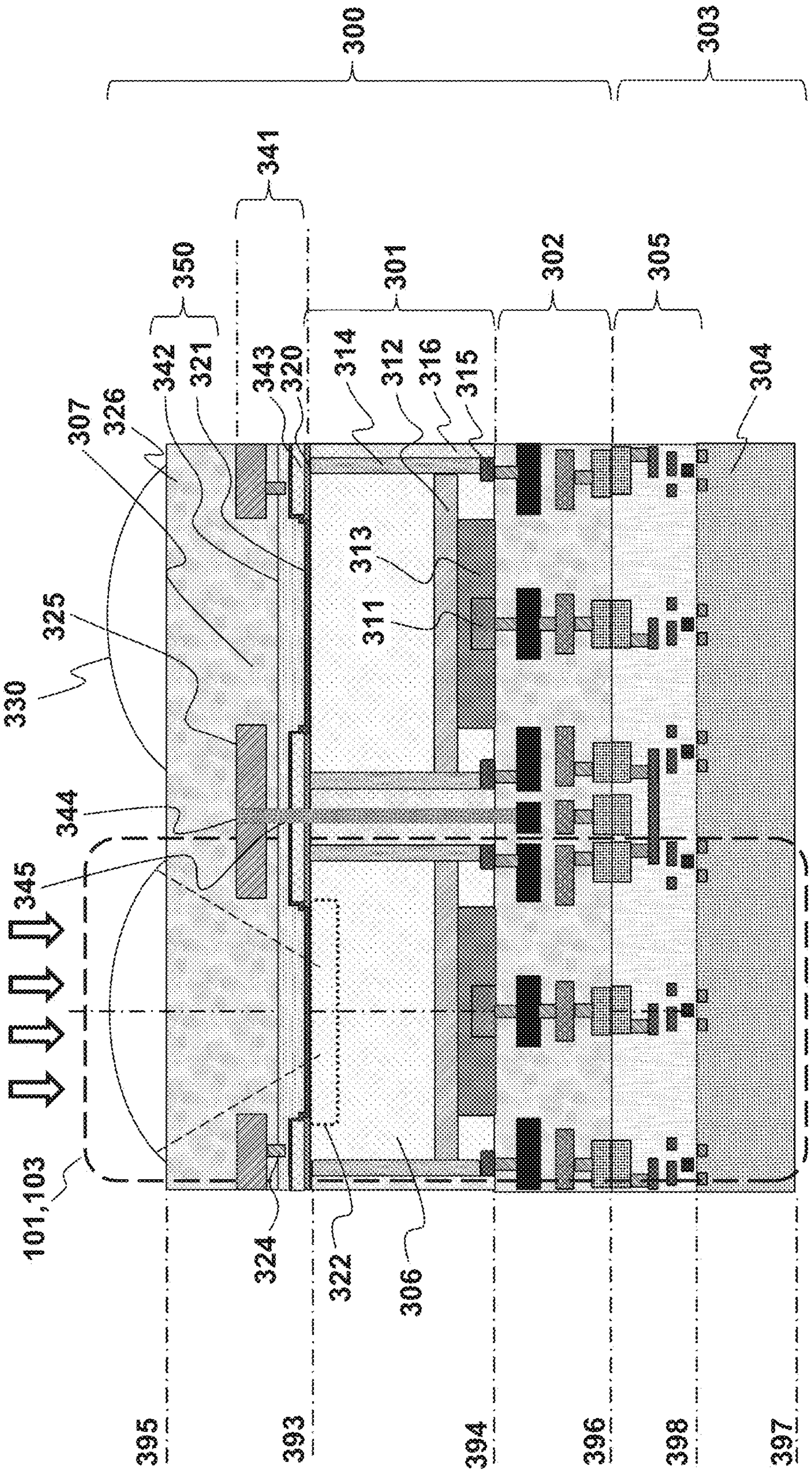
FIG. 10 is a sectional view showing the pixels according to the second embodiment.

The second embodiment of the present disclosure will be described below. Matters not mentioned as the second embodiment may comply with the first embodiment. The second embodiment is different from the first embodiment in terms of a potential supply path to an electrode film 350 of an SBD 221. FIGS. 9A, 9B, and 10 schematically show the structure of a photoelectric conversion apparatus 100 for two pixels according to the second embodiment. FIG. 9A shows an overlap of an APD 201 and the SBD 221 on the plane, and FIG. 9B shows an overlap of the SBD 221 and its peripheral members on the plane. FIG. 10 is a sectional view taken along a line A-A' in FIGS. 9A and 9B.

The photoelectric conversion apparatus 100 includes a through electrode 344 that extends through a first semiconductor layer 301 from a light shielding film 325 to reach a first wiring structure 302 (the conductive pattern thereof). The through electrode 344 may be understood as a member that extends through the first semiconductor layer 301 to connect the electrode film 350 and the conductive pattern of the first wiring structure 302. The through electrode 344 may be arranged to extend through an isolation trench 316 of the first semiconductor layer 301. As exemplified in FIG. 9A, the shapes of a second semiconductor region 312 and a fourth semiconductor region 314 are defined to ensure a space for passing the through electrode 344.

In the arrangement example shown in FIG. 10, the through electrode 344 is arranged between the two pixels. The through electrode 344 electrically connects the light shielding film 325 and the conductive pattern (a power supply line for a third potential VSB) within the first wiring structure 302. This applies the third potential VSB to the electrode film 350. A first electrode film 321 and a second electrode film 342 spread over a plurality of pixels, and may electrically be connected to the through electrode 344 via a through portion 345. In this arrangement, a plug 324 near the through electrode 344 may be omitted.

Figure 11A:
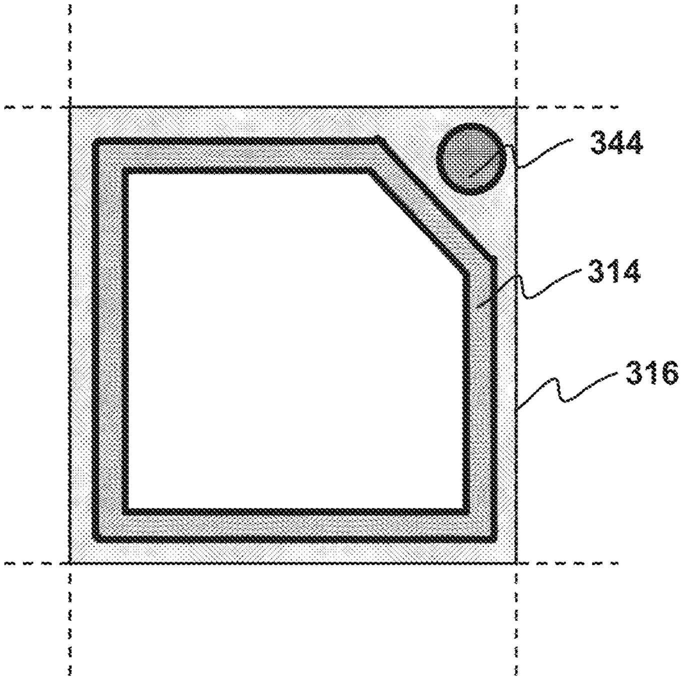
FIGS. 11A and 11B are sectional views each showing the pixels according to the second embodiment.
Figure 11B:
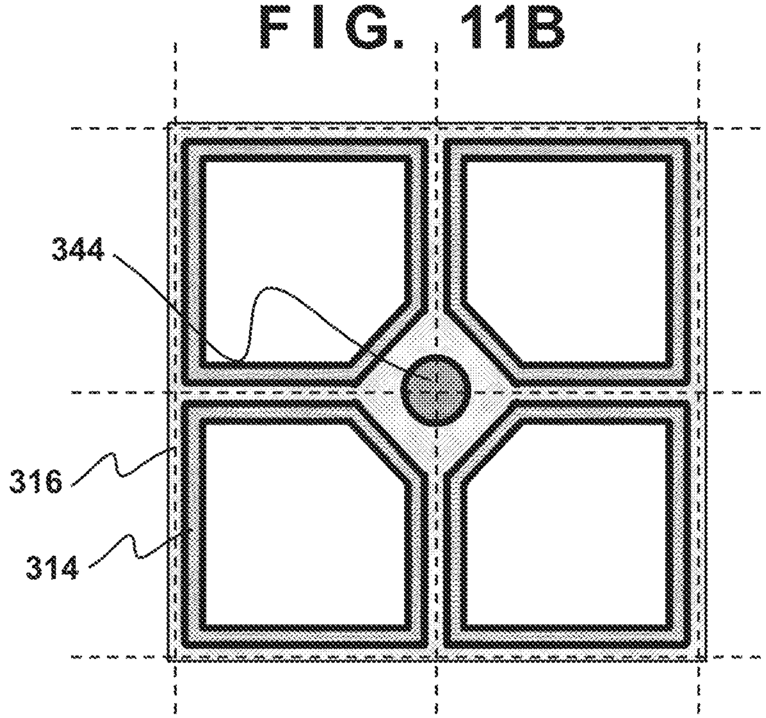

FIGS. 11A and 11B are schematic plan views each for explaining an example of the arrangement of the through electrode 344, the fourth semiconductor region 314, and the isolation trench 316. In the arrangement example shown in FIG. 11A, the through electrode 344 is arranged for each pixel. In the arrangement example shown in FIG. 11B, the through electrode 344 is arranged for every four pixels. A broken line schematically indicates the boundary between the pixels.

The shapes of the fourth semiconductor region 314 and the isolation trench 316 are optimized, as shown in the arrangement example shown in FIG. 11A, thereby implementing an arrangement in which one through electrode 344 is arranged for each pixel. More specifically, the arrangement may be implemented by cutting one or a plurality of corners of a rectangular pixel. However, depending on the size of the through electrode 344, the area within the fourth semiconductor region 314 may be decreased, and the area of a Schottky junction portion may become small, thereby decreasing sensitivity. Therefore, as shown in FIG. 11B, one through electrode 344 is assigned to four pixels, and is arranged in the central portion of the four pixels, thereby making it possible to minimize an area per pixel that is occupied by the through electrode 344 and its peripheral clearance.

According to the second embodiment, the third potential VSB may be applied to the electrode film 350 (first electrode film 321) at a short distance from the first wiring structure 302. Therefore, for example, even if the opening of the light shielding film 325 is large and the width of the light shielding film 325 between the pixels is small, it is possible to appropriately apply the third potential VSB to the SBD 221. In addition, the second embodiment is effective for an increase in number of pixels and a reduction in pixel size.

The third embodiment of the present disclosure will be described below. Matters not mentioned as the third embodiment may comply with the first or second embodiment. In the third embodiment, an electrode film 350 has unevenness on the lower surface (a surface contacting a first surface 393) and/or the upper surface (a surface on the opposite side of the first surface 393). Since the area of a Schottky junction portion increases by forming unevenness on the surface contacting the first surface 393 of the electrode film 350 (first electrode film 321), sensitivity may be improved. Forming unevenness on the upper surface (the surface on the opposite side of the first surface 393) of the electrode film 350 (a second electrode film 342) may contribute to reduction of the reflectance and improvement of the transmittance.

Figure 12:
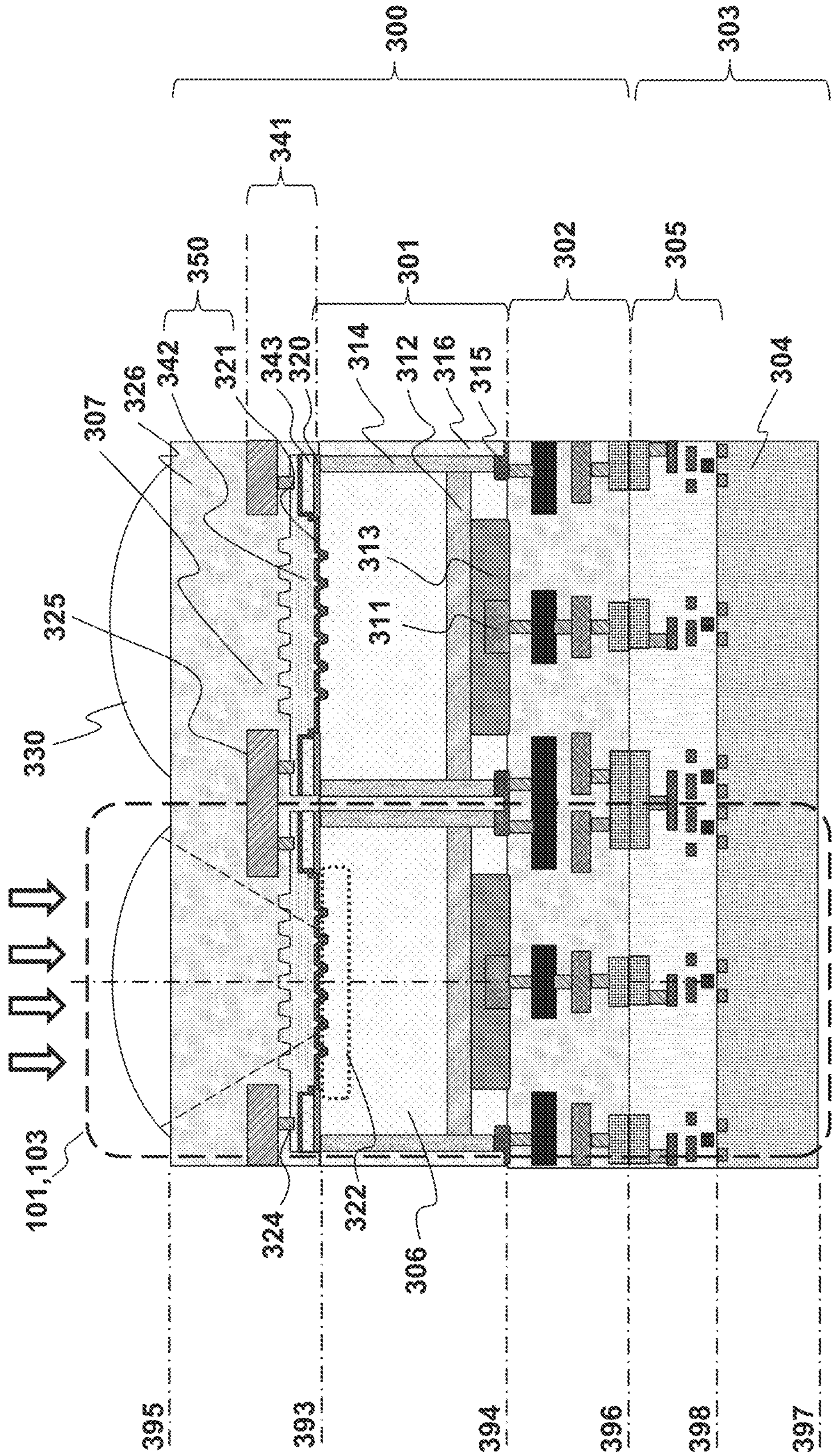
FIG. 12 is a sectional view showing pixels according to the third embodiment.
Figure 13A:
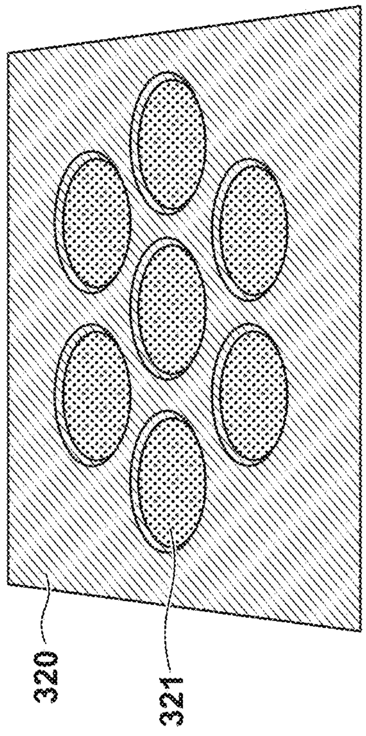
FIGS. 13A to 13D are views each showing an example of the arrangement of the first electrode film.
Figure 13B:
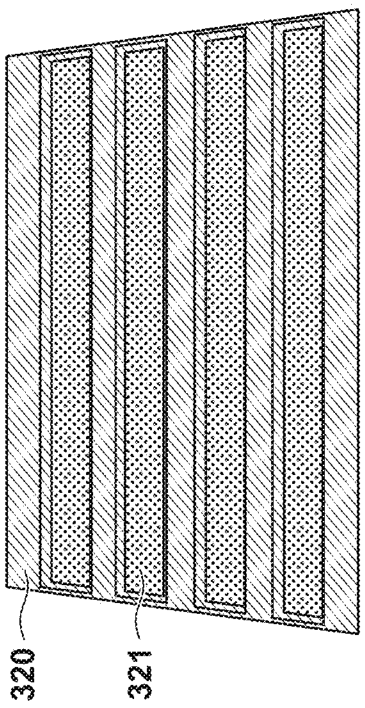
Figure 13C:
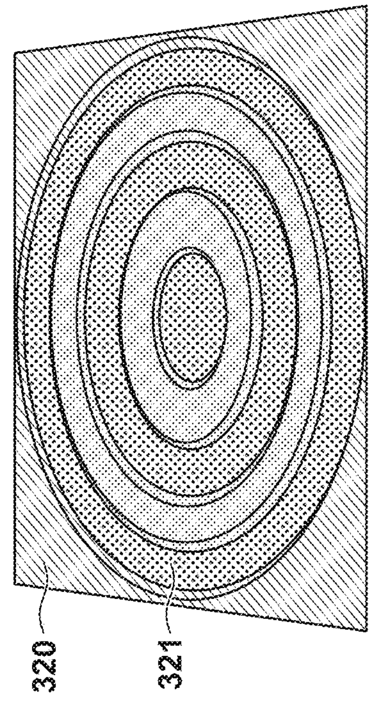
Figure 13D:
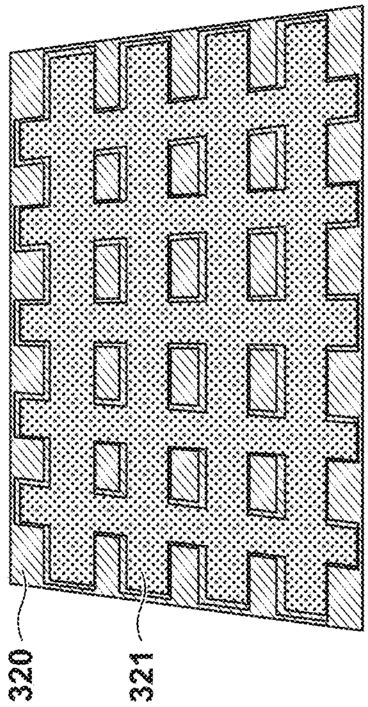

FIG. 12 schematically shows the sectional arrangement of the structure of a photoelectric conversion apparatus 100 for two pixels according to the third embodiment. The second electrode film 342 may have unevenness on the upper surface (the boundary surface between the second electrode film 342 and a sealing layer 326). A first electrode film 321 may have unevenness on the lower surface (the boundary surface with a first semiconductor layer 301). The uneven shape of the upper surface of the second electrode film 342 may be different from that of the lower surface of the first electrode film 321. The first electrode film 321 is typically a thin film, and thus the shape of the upper surface of the first electrode film 321 may conform to the shape of the lower surface of the first electrode film 321.

The shape of the lower surface of the first electrode film 321 may be defined by forming unevenness on the upper surface (that is, the first surface 393) of a semiconductor region 306 of the first semiconductor layer 301 and forming the first electrode film 321 thereon. The shape of the upper surface of the second electrode film 342 may be defined by forming a material film of the second electrode film 342 on the first electrode film 321 and then processing the surface of the material film by etching or the like.

Light entering the photoelectric conversion apparatus 100 may attenuate due to reflection and absorption at the interface between layers of different materials before reaching a depletion region 322. Absorption depends on a material used, and reflection occurs when the refractive index of a material changes at the interface, and depends on an incident angle and shape. The incident light passes through the sealing layer 326, the second electrode film 342, and the first electrode film 321, and reaches the Schottky junction portion. That is, the incident light passes through the interface between the sealing layer 326 and the second electrode film 342, the interface between the second electrode film 342 and the first electrode film 321, and the interface between the first electrode film 321 and the first semiconductor layer 301. To reduce reflection and refraction at the interface, the incident angle is changed and the change of the refractive index is relaxed.

In the third embodiment, by forming a shape having an uneven structure at the interface between the second electrode film 342 and the sealing layer 326 and the interface before and after the first electrode film 321, it is possible to reduce reflection of the incident light.

The shape of the interface may be a trapezoidal shape in a cross section, as exemplified in FIG. 12, and may be another shape. The uneven shape of the interface may be, for example, a shape that changes the incident angle of the light, such as a columnar or conical needle structure, a pyramid shape, a moth eye structure, or a diffraction structure.

Since the second electrode film 342 is located between the first electrode film 321 and the sealing layer 326, it is desirably made of a material having a refractive index between the refractive indices of the upper and lower layers. The second electrode film 342 is made to function as an antireflection film by suppressing a change in refractive index in an optical path, thereby reducing reflection of the incident light and increasing the transmittance. As the sealing layer 326, a layer having a plurality of reflectances may be provided to relax the refractive index difference with respect to the second electrode film 342. The transmittance may be increased by preventing a large change in reflectance, thereby improving sensitivity.

As described above, according to the third embodiment, light entering the photoelectric conversion apparatus 100 may be transmitted to the Schottky junction portion with a low loss, thereby improving sensitivity. By making the shape of the interface between the semiconductor region 306 and the first electrode film 321 complicated, the area of the Schottky junction interface may be increased. By increasing the area of the Schottky junction interface, it is possible to improve the sensitivity of an SBD 221. Note that the uneven structure of the third embodiment is applied to all of the interface between the first electrode film 321 and the first semiconductor layer 301, the interface between the first electrode film 321 and the second electrode film 342, and the interface between the second electrode film 342 and its adjacent layer (for example, the sealing layer 326) but may be applied to at least one interface.

A modification of each of the above-described embodiments will be described below. The first electrode film 321 may have an island-like shape without extending to the plug 324 in the region of the pixel. FIGS. 13A to 13D show various examples in each of which the first electrode film 321 is arranged in the opening of the pinning film 320. In the arrangement example shown in FIG. 13A, a plurality of circular first electrode films 321 are arranged. In the arrangement example shown in FIG. 13B, a plurality of first electrode films 321 are arranged concentrically. In the arrangement example shown in FIG. 13C, a plurality of stripe-shaped first electrode films 321 are arranged. In the arrangement example shown in FIG. 13D, the first electrode film 321 is formed in a grid pattern. In the arrangement example shown in each of FIGS. 13A to 13D, the second electrode film 342 may be arranged to cover the first electrode film 321 and the pinning film 320, and the third potential VSB may be applied to the first electrode film 321 via the second electrode film 342.

A diffraction structure, interference structure, or resonance structure such as an antenna or a metasurface may be applied to the first electrode film 321. The plurality of first electrode films 321 isolated from each other may be made of different materials, which may contribute to improvement of sensitivity and extension of a detected wavelength.

Figure 14:
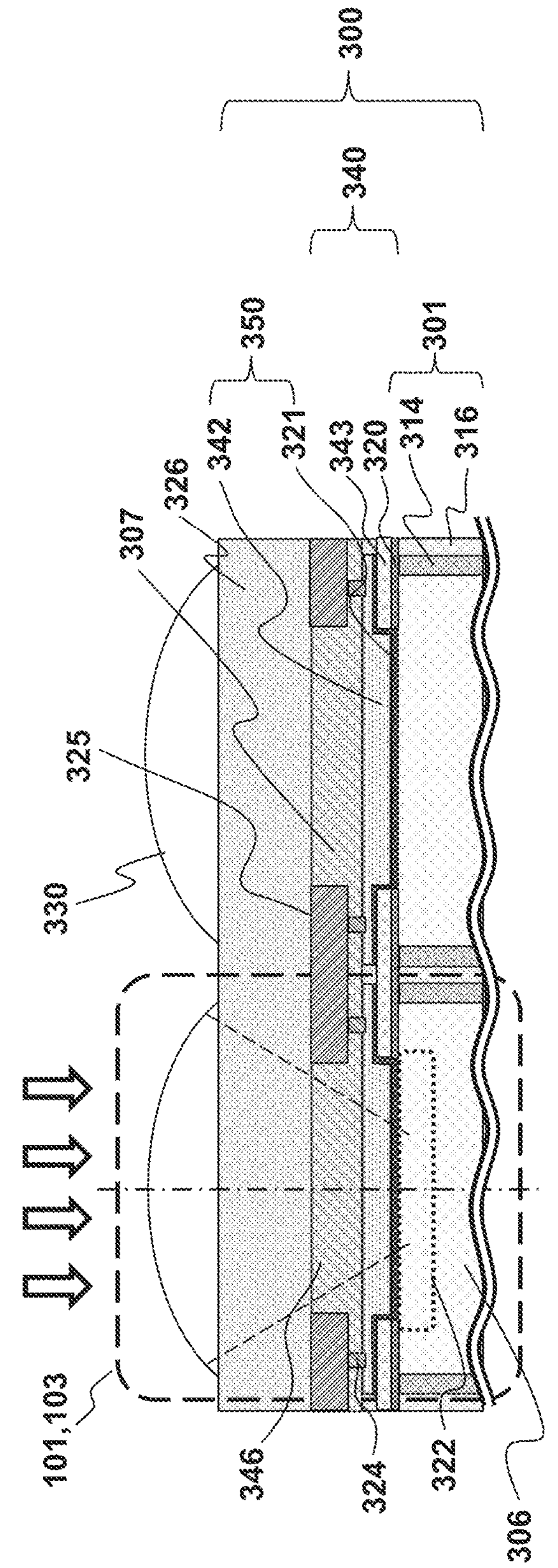
FIG. 14 is a view showing a modification of the first to third embodiments.

FIG. 14 shows another modification. The photoelectric conversion apparatus 100 shown in FIG. 14 includes an antireflection layer 346. The antireflection layer 346 may be arranged between the electrode film 350 and the sealing layer 326. In FIG. 14, the antireflection layer 346 is arranged in the opening 307 of the light shielding film 325 but may be provided to cover the light shielding film 325 and its opening 307. The antireflection layer 346 may be a dielectric having a refractive index between the refractive index of the sealing layer 326 and that of the second electrode film 342.

Figure 15:
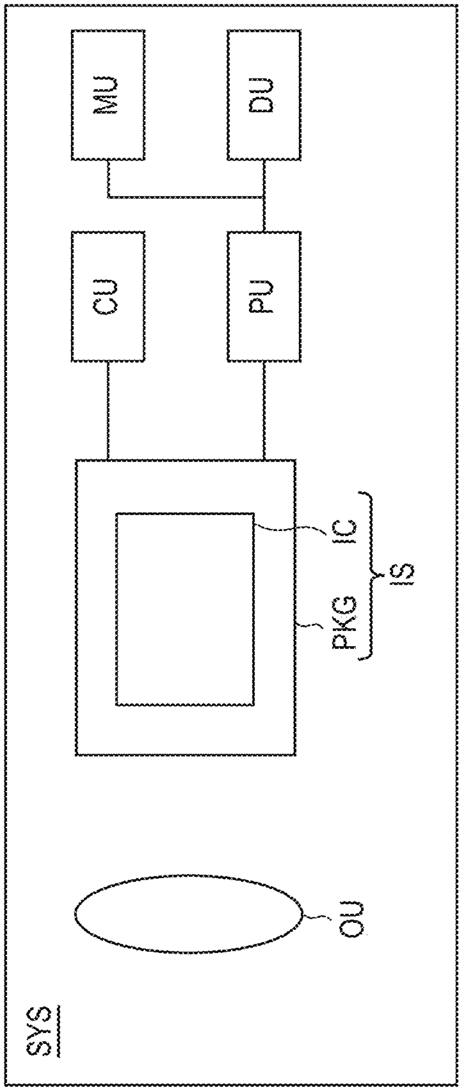
FIG. 15 is a view showing an example of the configuration of a photoelectric conversion system.

A photoelectric conversion system incorporating the photoelectric conversion apparatus exemplarily described through each of the above embodiments will exemplarily be described below. FIG. 15 shows an example of the photoelectric conversion system. The photoelectric conversion apparatus described in each of the above embodiments is applicable to various photoelectric conversion systems. Examples of the applicable photoelectric conversion systems are a digital still camera, a digital camcorder, a monitoring camera, a copying machine, a facsimile apparatus, a mobile phone, an in-vehicle camera, and an observation satellite. A camera module including an image capturing apparatus and an optical system such as a lens is also included in the photoelectric conversion systems.

The photoelectric conversion system is formed as, for example, an image capturing system SYS. The image capturing system SYS is a camera or an information terminal having an imaging function. An image capturing apparatus IS may further include a package PKG accommodating the photoelectric conversion apparatus 100 formed as an image capturing device IC. The package PKG may include a base on which the image capturing device IC is fixed, a cover facing the image capturing device IC, and a connection member for connecting a terminal of the base and a terminal of the image capturing device IC. The image capturing apparatus IS may arrange and mount the plurality of image capturing devices IC on the common package PKG. The image capturing apparatus IS may also stack and mount the image capturing device IC and another semiconductor device IC on the common package PKG.

The image capturing system SYS may include an optical system OU that forms an image on the image capturing apparatus IS. The image capturing system SYS may include at least one of a control apparatus CU that controls the image capturing apparatus IS, a processing apparatus PU that processes a signal obtained from the image capturing apparatus IS, and a display apparatus DU that displays an image obtained from the image capturing apparatus IS. Furthermore, the image capturing system SYS may include a storage apparatus MU that stores the image obtained from the image capturing apparatus IS.

Figure 16A:
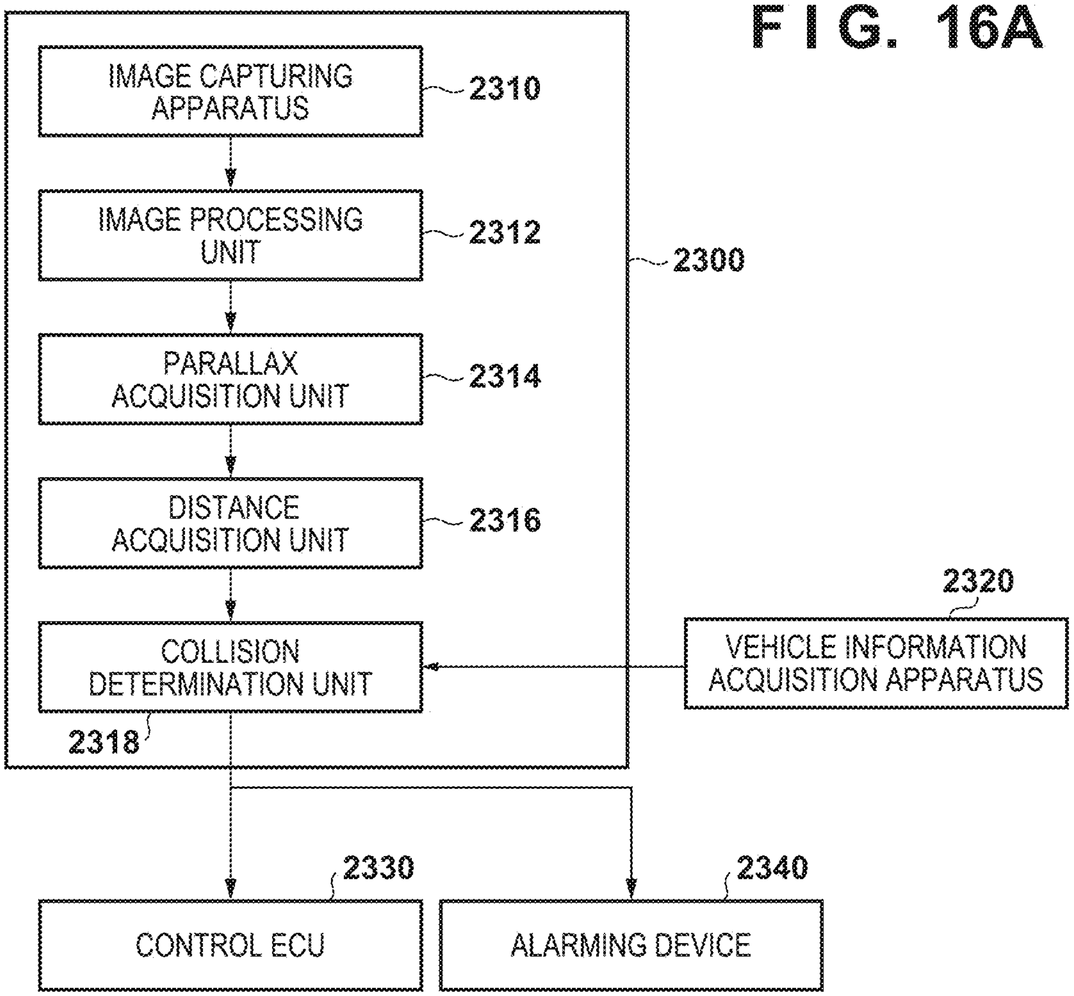
FIGS. 16A and 16B are views showing an example of the configuration of a photoelectric conversion system.

FIG. 16A exemplifies the configuration of a photoelectric conversion system applied to an in-vehicle camera. A photoelectric conversion system 2300 may include the photoelectric conversion apparatus 100 formed as an image capturing apparatus 2310. The photoelectric conversion system 2300 includes an image processing unit 2312 that performs image processing for a plurality of image data acquired by the image capturing apparatus 2310, and a parallax acquisition unit 2314 that calculates a parallax (the phase difference between parallax images) from the plurality of image data acquired by the photoelectric conversion system 2300. The photoelectric conversion system 2300 also includes a distance acquisition unit 2316 that calculates the distance up to a target object based on the calculated parallax, and a collision determination unit 2318 that determines, based on the calculated distance, whether there is collision possibility. Here, the parallax acquisition unit 2314 and the distance acquisition unit 2316 are examples of a distance information acquisition unit that acquires distance information up to a target object. That is, the distance information is information concerning a parallax, a defocus amount, a distance up to a target object, and the like.

The collision determination unit 2318 may determine collision possibility using one of the pieces of distance information. The distance information acquisition unit may be implemented by exclusively designed hardware, or may be implemented by a software module. The distance information acquisition unit may be implemented by a Field Programmable Gate Array (FPGA) or Application Specific Integrated Circuit (ASIC), or may be implemented by a combination of these.

The photoelectric conversion system 2300 is connected to a vehicle information acquisition apparatus 2320, and may acquire vehicle information such as a vehicle speed, a yaw rate, and a steering angle. The photoelectric conversion system 2300 is also connected to a control ECU 2330 that is a control unit configured to output a control signal for generating a braking force to the vehicle based on the determination result of the collision determination unit 2318. Furthermore, the photoelectric conversion system 2300 is connected to an alarm device 2340 that generates an alarm to the driver based on the determination result of the collision determination unit 2318. For example, if collision possibility is high as the determination result of the collision determination unit 2318, the control ECU 2330 performs vehicle control of braking, releasing the accelerator pedal, or suppressing the engine output, thereby avoiding collision and reducing damage. The alarm device 2340 sounds an alarm, displays alarm information on the screen of a car navigation system or the like, or applies a vibration to the seat belt or a steering wheel, thereby making an alarm to the user. In this embodiment, the periphery of the vehicle, for example, the front or rear side is captured by the photoelectric conversion system 2300.

Figure 16B:
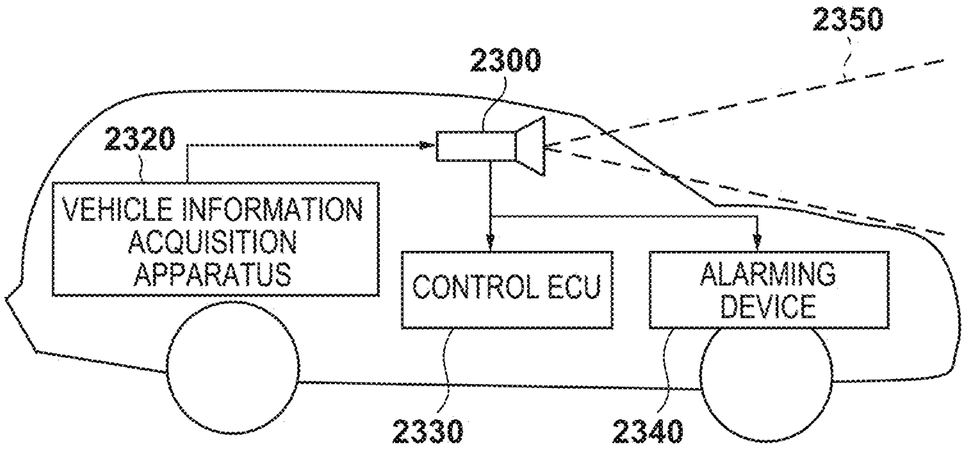

FIG. 16B shows the photoelectric conversion system configured to capture the front side (image capturing range 2350) of the vehicle. The vehicle information acquisition apparatus 2320 sends an instruction to the photoelectric conversion system 2300 or the image capturing apparatus 2310. With this configuration, it is possible to further improve the accuracy of distance measurement.

An example in which control is executed so as not to collide with another vehicle has been explained above. The system may also be applied to control of performing automated driving following another vehicle or control of performing automated driving without deviating from a lane. Furthermore, the photoelectric conversion system may be applied not only to a vehicle such as an automobile but also to, for example, a moving body (moving apparatus) such as a ship, an airplane, or an industrial robot. In addition, the photoelectric conversion system may be applied not only to a moving body but also to an apparatus that broadly uses object recognition, such as an intelligent transport system (ITS).

Figure 17:
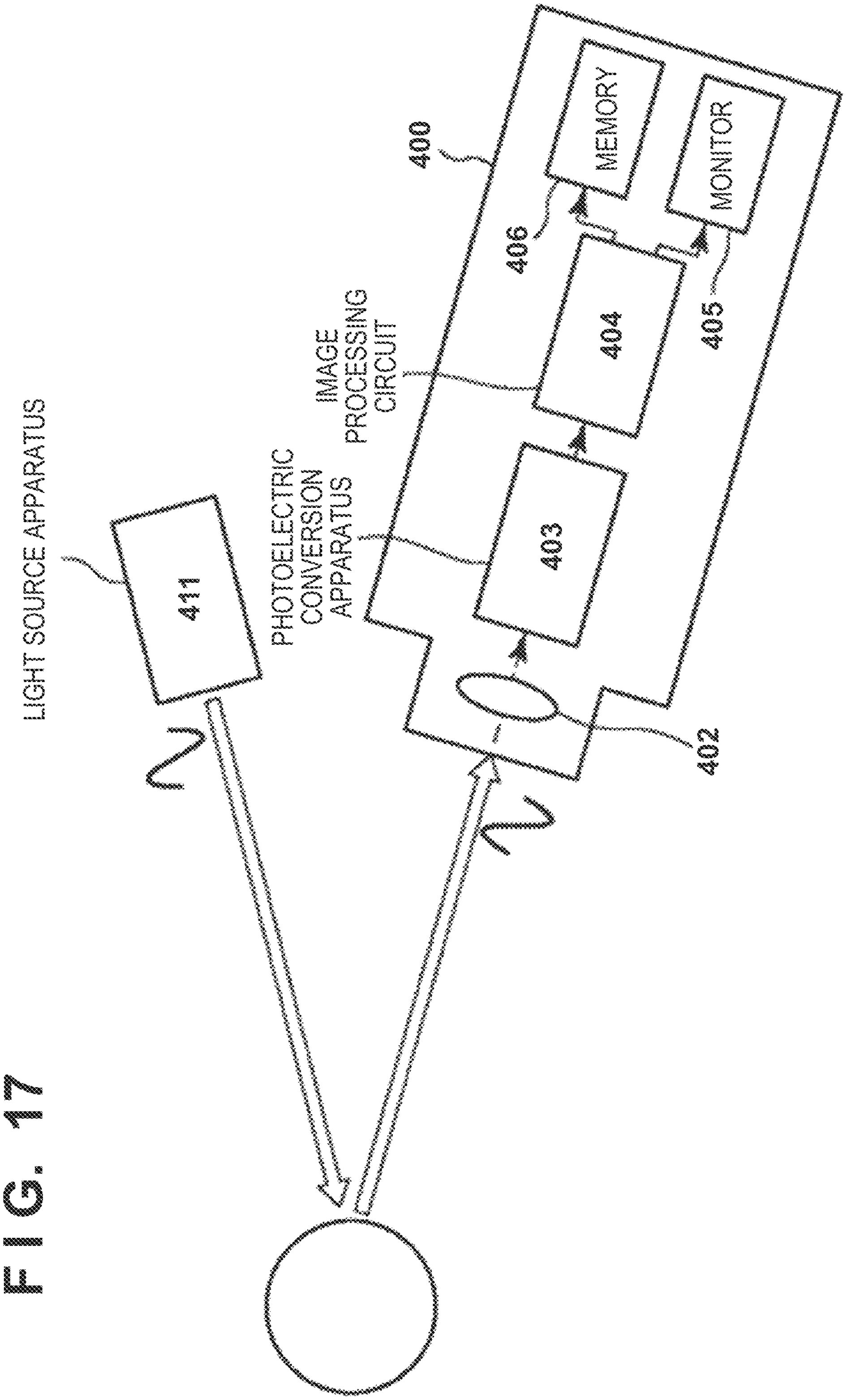
FIG. 17 is a view showing an example of the configuration of a photoelectric conversion system.

FIG. 17 exemplifies the configuration of a photoelectric conversion system formed as a distance image sensor. A distance image sensor 400 includes an optical system 407, a photoelectric conversion apparatus 408, an image processing circuit 404, a monitor 405, and a memory 406. Then, the distance image sensor 400 may receive light (modulated light or pulsed light) projected from a light source apparatus 409 toward an object and reflected by the surface of the object, thereby acquiring a distance image corresponding to the distance up to the object.

The optical system 407 is formed by including one or a plurality of lenses, and guides image light (incident light) from the object to the photoelectric conversion apparatus 408 and forms an image on the light-receiving surface (sensor portion) of the photoelectric conversion apparatus 408. As the photoelectric conversion apparatus 408, the photoelectric conversion apparatus of each of the above-described embodiments is applied, and a distance signal indicating a distance obtained from a light reception signal output from the photoelectric conversion apparatus 408 is supplied to the image processing circuit 404.

The image processing circuit 404 performs image processing of creating a distance image based on the distance signal supplied from the photoelectric conversion apparatus 408. Then, the distance image (image data) obtained by the image processing is supplied to and displayed on the monitor 405, and supplied to and stored (recorded) in the memory 406. The distance image sensor 400 having such arrangement may acquire, for example, a more correct distance image along with improvement in characteristic of pixels by applying the above-described photoelectric conversion apparatus.

According to the disclosure, there is provided a technique advantageous in improving sensitivity to the infrared range in a photoelectric conversion apparatus including an avalanche photodiode.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-083184, filed May 19, 2023, which is hereby incorporated by reference herein in its entirety.

What is claimed is:

1. A photoelectric conversion apparatus comprising:

a semiconductor layer having a first surface and a second surface;

an avalanche photodiode arranged in the semiconductor layer;

an electrode film arranged to contact the first surface; and a wiring structure arranged to contact the second surface, wherein at least part of light from an outside enters the semiconductor layer via the electrode film, and the electrode film includes a first electrode film arranged to contact the first surface such that a Schottky barrier diode is formed in a contact portion with the semiconductor layer, and a second electrode film containing a material different from the first electrode film and arranged to overlap the first electrode film.

2. The apparatus according to claim 1, wherein a sheet resistance value of the second electrode film is lower than a sheet resistance value of the first electrode film.

3. The apparatus according to claim 1, wherein at a wavelength of light to which the avalanche photodiode has sensitivity, a light transmittance of the first electrode film per unit thickness is lower than a light transmittance of the second electrode film per unit thickness.

4. The apparatus according to claim 1, wherein a sheet resistance value of the second electrode film is lower than a sheet resistance value of the first electrode film, and at a wavelength of light to which the avalanche photodiode has sensitivity, a light transmittance of the first electrode film per unit thickness is lower than a light transmittance of the second electrode film per unit thickness.

5. The apparatus according to claim 4, wherein the second electrode film has a multilayer structure.

6. The apparatus according to claim 4, wherein the electrode film further includes a third electrode film arranged between the first electrode film and the second electrode film.

7. The apparatus according to claim 1, wherein the first electrode film has a thickness not larger than 100 nm.

8. The apparatus according to claim 1, wherein the avalanche photodiode is arranged between the second surface and the Schottky barrier diode.

9. The apparatus according to claim 1, wherein in an orthogonal projection to the second surface, the avalanche photodiode and the Schottky barrier diode overlap each other.

10. The apparatus according to claim 1, wherein the electrode film is applied with a potential to form a depletion region in the semiconductor layer.

11. The apparatus according to claim 1, wherein the avalanche photodiode and the Schottky barrier diode are series-connected via a depletion region.

12. The apparatus according to claim 1, further comprising a microlens, wherein the electrode film is arranged between the microlens and the first surface.

13. The apparatus according to claim 1, wherein the avalanche photodiode includes a first semiconductor region of a first conductivity type, a second semiconductor region of a second conductivity type, and a third semiconductor region of the first conductivity type arranged between the second surface and the second semiconductor region, and the third semiconductor region includes a portion arranged between the second surface and the second semiconductor region to surround a side surface of the first semiconductor region, and a portion arranged between the first semiconductor region and the second semiconductor region.

14. The apparatus according to claim 13, wherein in a direction along the first surface, a dimension of a region where the first electrode film contacts the first surface is larger than a dimension of the first semiconductor region.

15. The apparatus according to claim 1, further comprising a light shielding film, wherein the light shielding film is arranged so that the first surface is located between the second surface and the light shielding film, and the light shielding film includes an opening that defines light entering the Schottky barrier diode.

16. The apparatus according to claim 15, wherein the light shielding film is electrically connected to the electrode film.

17. The apparatus according to claim 16, wherein a potential applied to the electrode film is lower than a potential applied to an anode of the avalanche photodiode.

18. The apparatus according to claim 15, wherein the avalanche photodiode includes a first semiconductor region of a first conductivity type, a second semiconductor region of a second conductivity type, and a third semiconductor region of the first conductivity type arranged between the second surface and the second semiconductor region, and the third semiconductor region includes a portion arranged between the second surface and the second semiconductor region to surround a side surface of the first semiconductor region, and a portion arranged between the first semiconductor region and the second semiconductor region.

19. The apparatus according to claim 18, further comprising a fourth semiconductor region of the second conductivity type electrically connected to the second semiconductor region and extending between the first surface and the second surface in a direction orthogonal to the first surface, wherein a potential is applied to the second semiconductor region via the fourth semiconductor region.

20. The apparatus according to claim 19, wherein the fourth semiconductor region is arranged to surround the first semiconductor region, the second semiconductor region, and the third semiconductor region.

21. The apparatus according to claim 20, further comprising a fifth semiconductor region of the second conductivity type arranged between the second surface and the fourth semiconductor region.

22. The apparatus according to claim 1, further comprising a pinning film configured to cover the first surface, wherein the pinning film includes an opening, and the electrode film contacts the first surface via the opening of the pinning film.

23. The apparatus according to claim 22, further comprising a light shielding film, wherein the light shielding film is arranged so that the first surface is located between the second surface and the light shielding film, and the light shielding film includes an opening that defines light entering the Schottky barrier diode.

24. The apparatus according to claim 23, further comprising a plug configured to electrically connect the light shielding film and the electrode film.

25. The apparatus according to claim 24, wherein the electrode film includes a region that covers the pinning film, and the plug is connected to the electrode film in the region.

26. The apparatus according to claim 25, further comprising an insulating film arranged between the plug and the pinning film.

27. The apparatus according to claim 23, further comprising a through electrode extending through the semiconductor layer from the light shielding film to reach the wiring structure.

28. The apparatus according to claim 1, further comprising a sealing layer configured to cover the electrode film, wherein the second electrode film has a refractive index between a refractive index of the first electrode film and a refractive index of the sealing layer.

29. The apparatus according to claim 1, further comprising an antireflection film arranged to cover the electrode film.

30. The apparatus according to claim 1, wherein the electrode film has unevenness on a surface contacting the first surface.

31. The apparatus according to claim 1, wherein the electrode film has an uneven surface on an opposite side of the first surface.

32. A photoelectric conversion system comprising:

a photoelectric conversion apparatus defined in claim 1; and a signal processing circuit configured to process a signal output from the photoelectric conversion apparatus.

* * * * *